United States Patent
Dong et al.

(10) Patent No.: US 8,361,340 B2
(45) Date of Patent: Jan. 29, 2013

(54) REMOVAL OF SURFACE OXIDES BY ELECTRON ATTACHMENT

(75) Inventors: Chun Christine Dong, Macungie, PA (US); Richard E. Patrick, Tamaqua, PA (US); Gregory Khosrov Arslanian, Pipersville, PA (US); Ranajit Ghosh, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 901 days.

(21) Appl. No.: 12/433,108

(22) Filed: Apr. 30, 2009

(65) Prior Publication Data
US 2009/0236236 A1 Sep. 24, 2009

Related U.S. Application Data

(63) Continuation-in-part of application No. 12/119,701, filed on May 13, 2008, now Pat. No. 7,897,029, which is a continuation-in-part of application No. 12/042,055, filed on Mar. 4, 2008, now Pat. No. 8,119,016, which is a continuation of application No. 10/425,405, filed on Apr. 28, 2003, now Pat. No. 7,387,738.

(60) Provisional application No. 61/086,313, filed on Aug. 5, 2008.

(51) Int. Cl.
C25F 1/00 (2006.01)
C25F 7/00 (2006.01)

(52) U.S. Cl. .......... 216/63; 216/76; 205/766; 204/230.2

(58) Field of Classification Search .................. None
See application file for complete search history.

(56) References Cited

U.S. PATENT DOCUMENTS

| | | |
|---|---|---|
| 3,742,213 A | 6/1973 | Cohen et al. |
| 5,102,523 A | 4/1992 | Beisswenger et al. |
| 5,105,761 A | 4/1992 | Charlet et al. |
| 5,192,582 A | 3/1993 | Liedke et al. |
| 5,345,056 A | 9/1994 | Frei et al. |
| 5,409,543 A | 4/1995 | Panitz et al. |
| 5,433,820 A | 7/1995 | Sindzingre et al. |
| 5,459,632 A | 10/1995 | Birang et al. |
| 5,481,084 A | 1/1996 | Patrick et al. |
| 5,493,177 A | 2/1996 | Muller et al. |
| 5,722,581 A | 3/1998 | Sindzingre et al. |
| 5,790,365 A | 8/1998 | Shel |
| 5,807,614 A | 9/1998 | Sindzingre et al. |

(Continued)

FOREIGN PATENT DOCUMENTS

| | | |
|---|---|---|
| DE | 197 17 698 | 10/1998 |
| EP | 0997926 | 5/2000 |

(Continued)

OTHER PUBLICATIONS

Potier N., Fluxless soldering under activated atmosphere at ambient pressure, Proc. SMI 1995, pp. 453-458.

(Continued)

*Primary Examiner* — Allan Olsen
(74) *Attorney, Agent, or Firm* — Rosaleen P. Morris-Oskanian

(57) ABSTRACT

Described herein are a method and an apparatus for removing metal oxides from a substrate surface within a target area. In one particular embodiment, the method and apparatus has an energizing electrode which has an array of protruding conductive tips that are electrically connected by a conductive wire and separated into a first electrically connected group and a second electrically connected group wherein at least a portion of the conductive tips are activated by a DC voltage source that is negatively biased to generate electrons within the target area that attach to at least a portion of a reducing gas that is present in the target area to form a negatively charged reducing gas that contacts the treating surface to reduce the metal oxides on the treating surface of the substrate.

21 Claims, 18 Drawing Sheets

U.S. PATENT DOCUMENTS

| | | | |
|---|---|---|---|
| 5,807,615 A | 9/1998 | Sindzingre et al. | |
| 5,827,158 A | 10/1998 | Drecksel | |
| 5,858,312 A | 1/1999 | Sindzingre et al. | |
| 5,928,527 A | 7/1999 | Li et al. | |
| 5,941,448 A | 8/1999 | Sindzingre et al. | |
| 5,985,378 A | 11/1999 | Paquet | |
| 6,004,631 A | 12/1999 | Mori | |
| 6,007,637 A | 12/1999 | Sindzingre et al. | |
| 6,021,940 A | 2/2000 | Sindzingre et al. | |
| 6,037,241 A | 3/2000 | Powell et al. | |
| 6,080,283 A | 6/2000 | Ray | |
| 6,089,445 A | 7/2000 | Sindzingre et al. | |
| 6,146,503 A | 11/2000 | Sindzingre et al. | |
| 6,158,648 A | 12/2000 | Mori et al. | |
| 6,174,500 B1 | 1/2001 | Uno et al. | |
| 6,193,135 B1 | 2/2001 | Fang et al. | |
| 6,194,036 B1 | 2/2001 | Babayan et al. | |
| 6,196,446 B1 | 3/2001 | Fang et al. | |
| 6,203,637 B1 | 3/2001 | Dommann et al. | |
| 6,250,540 B1 | 6/2001 | Egitto et al. | |
| 6,270,862 B1 | 8/2001 | McMillin et al. | |
| 6,468,833 B2 | 10/2002 | Uner et al. | |
| 6,551,860 B2 | 4/2003 | Uner et al. | |
| 6,605,175 B1 | 8/2003 | Ramm et al. | |
| 6,620,299 B1 | 9/2003 | Fietzke et al. | |
| 6,656,540 B2 | 12/2003 | Sakamoto et al. | |
| 6,716,302 B2 | 4/2004 | Carducci et al. | |
| 6,734,102 B2 | 5/2004 | Rathi et al. | |
| 6,776,330 B2 | 8/2004 | Dong et al. | |
| 6,946,401 B2 | 9/2005 | Huang et al. | |
| 7,079,370 B2 | 7/2006 | Dong et al. | |
| 7,307,826 B2 | 12/2007 | Dong et al. | |
| 7,632,379 B2 * | 12/2009 | Goto et al. | 156/345.44 |
| 7,897,029 B2 * | 3/2011 | Dong et al. | 205/684 |
| 2002/0070357 A1 | 6/2002 | Kim et al. | |
| 2003/0047591 A1 | 3/2003 | Dong et al. | |
| 2004/0018320 A1 | 1/2004 | Nicolussi | |
| 2004/0094400 A1 | 5/2004 | Ichiki et al. | |
| 2004/0211675 A1 | 10/2004 | Dong et al. | |
| 2004/0226831 A1 | 11/2004 | Dong et al. | |
| 2004/0231597 A1 | 11/2004 | Dong et al. | |
| 2005/0183666 A1 | 8/2005 | Tsuji et al. | |
| 2005/0241670 A1 | 11/2005 | Dong et al. | |

FOREIGN PATENT DOCUMENTS

| | | |
|---|---|---|
| EP | 1291111 | 3/2003 |
| EP | 1 473 105 A | 11/2004 |
| EP | 1 475 179 A | 11/2004 |
| EP | 1795291 | 6/2007 |
| EP | 1827066 | 8/2007 |
| JP | 11214320 | 8/1999 |
| JP | 2000311868 | 11/2000 |
| JP | 2001267729 | 9/2001 |
| JP | 2002367962 | 12/2002 |
| WO | 9901886 | 1/1999 |
| WO | 00/65887 A | 11/2000 |
| WO | 0141963 | 6/2001 |

OTHER PUBLICATIONS

Koopman N. et al, Fluxless flip chip solder joining, Nepcon West Feb. 1995, pp. 919-931.

Shiloh P.J. et al, Flux-free soldering, Nepcon Proc. vol. 1, Mar. 1994, pp. 251-273.

Dong C.C. et al, Removal of surface oxides by electron attachment for wafer bumping applications, U.S. Appl. No. 12/042,055, filed Mar. 4, 2008.

* cited by examiner

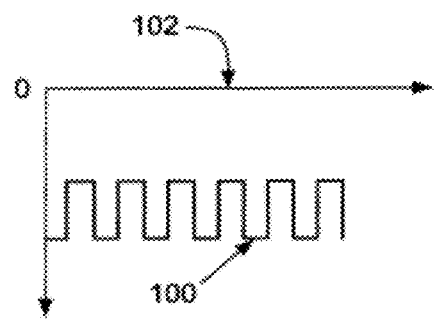
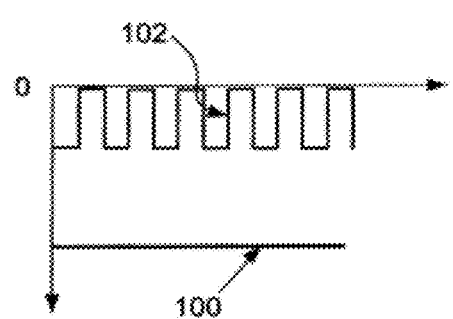
Figure 1a     Figure 1b
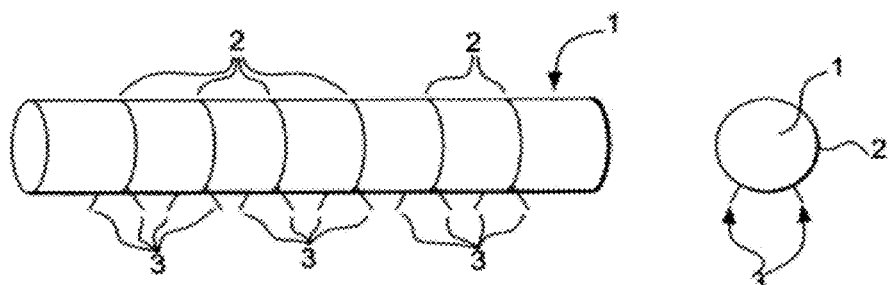
Figure 3
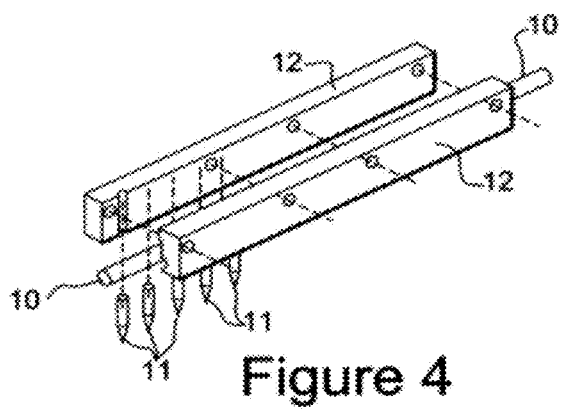
Figure 4

REMOVAL OF SURFACE OXIDES BY ELECTRON ATTACHMENT

CROSS-REFERENCE TO RELATED APPLICATIONS

This application is a continuation-in-part of U.S. patent application Ser. No. 12/119,701, a continuation-in part of U.S. patent application Ser. No. 12/042,055, which, in turn, is a continuation of U.S. patent application Ser. No. 10/425,405, filed Apr. 28, 2003, the disclosures of which are incorporated herein by reference in their entirety. This application also claims the benefit of U.S. Provisional Application Ser. No. 61/086,313 filed Aug. 5, 2008, the disclosure of which is incorporated herein by reference in its entirety.

BACKGROUND OF THE INVENTION

Described herein are fluxless processes for removing metal oxides from the surface of a substrate, including an insulated substrate. Also described herein is an apparatus for removing metal oxides from the surface of a substrate.

Wafer bumping is a process used to make thick metal bumps on the chip bond pads for inner lead bonding. The bumps are commonly made by depositing a solder on the pads and then reflowing (referred to herein as a first reflow) to conduct alloying and to change the shape of the solder bump from a mushroom-shape into a hemispherical-shape. The chip with the first-reflowed bumps is "flipped" to correspond to the footprint of the solder wettable terminals on the substrate and then subjected to a second reflow to form solder joints. These solder joints are referred to herein as inner lead bonds. High-melting point solders (e.g., >300° C.) are normally used in the wafer bumping process because it allows for subsequent assembly steps such as outer lead bonding to proceed using lower-melting point solders (e.g., <230° C.) without disruption of the inner lead bonds.

The shape of the solder bumps after the first reflow is critical. For example, a large bump height is preferable for better bonding and higher fatigue resistance. Further, the bumps formed should preferably be substantially uniform to ensure planarity. Substantially uniform solder bumps having relatively larger bump heights is believed to be associated with an oxide-free bump surface during the first reflow. Currently, there are two major approaches to removing solder oxides during the first reflow of the solder bumped wafer. One approach is fluxless soldering using pure hydrogen at a reflow temperature of 400 to 450° C. The major challenge of this approach is the flammable nature of the pure hydrogen, which largely limits the application of this approach. The second approach is applying organic fluxes over the deposited solder bumps, or within a solder paste mixture that has been printed onto the wafer to form the bumps, and reflowing the bumps in an inert environment so that the fluxes can effectively remove initial oxides on the solder surface. However, this approach has its drawbacks. Small voids may form in the solder bumps due to flux decomposition. These voids may not only degrade the electrical and mechanical properties of the formed solder bonds but also destroy the co-planarity of the solder bumped wafer and affect the subsequent chip bonding process. The decomposed flux volatiles can also contaminant the reflow furnace which can increase the maintenance cost. In addition, flux residues are oftentimes left upon the wafer which can corrode metals and degrade the performance of the assembly.

To remove the flux residues from the reflow processes described above, a post cleaning process may be adopted using chlorofluorcarbons (CFCs) as cleaning agents. However, post-cleaning adds an additional process step and increases the manufacturing processing time. Further, the use of chlorofluorocarbons (CFCs) as cleaning agents is banned due to the potential damage to the earth's protective ozone layer. Although no-clean fluxes have been developed by using a small amount of activators to reduce residues, there is a trade-off between the gain and loss in the amount of flux residues and the activity of the fluxes. Therefore, a catalytic method to assist generating highly reactive $H_2$ radicals, and thus reducing the effective ranges of hydrogen concentration and processing temperature for reducing surface oxides, has been sought by the industry.

Fluxless (dry) soldering has been performed in the prior art using several techniques. One technique is to employ lasers to ablate or heat metal oxides to their vaporization temperatures. Such processes are typically performed under inert or reducing atmospheres to prevent re-oxidation by the released contaminants. However, the melting or boiling points of the oxide and base metal can be similar and it may not be desirable to melt or vaporize the base metal. Therefore, such laser processes are difficult to implement. Lasers are typically expensive and inefficient to operate and require a direct line of sight to the oxide layer. These factors limit the usefulness of laser techniques for most soldering applications.

Surface oxides can be chemically reduced (e.g., to $H_2O$) through exposure to reactive gases (e.g., $H_2$) at elevated temperatures. A mixture containing 5% or greater reducing gas in an inert carrier (e.g., $N_2$) is typically used. The reaction products (e.g., $H_2O$) are then released from the surface by desorption at the elevated temperature and carried away in the gas flow field. Typical process temperatures exceed 350° C. However, this process can be slow and ineffective, even at elevated temperatures.

The speed and effectiveness of the reduction process can be increased using more active reducing species. Such active species can be produced using conventional plasma techniques. Gas plasmas at audio, radio, or microwave frequencies can be used to produce reactive radicals for surface de-oxidation. In such processes, high intensity electromagnetic radiation is used to ionize and dissociate $H_2$, $O_2$, $SF_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process rather than a faster, continuous process. Also, plasmas are typically dispersed diffusely within the process chamber and are difficult to direct at a specific substrate area. Therefore, the reactive species cannot be efficiently utilized in the process. Plasmas can also cause damage to process chambers through a sputtering process, and can produce an accumulation of space charge on dielectric surfaces, leading to possible microcircuit damage. Microwaves themselves can also cause microcircuit damage, and substrate temperature may be difficult to control during treatment. Plasmas can also release potentially dangerous ultraviolet light. Such processes also require expensive electrical equipment and consume considerable power, thereby reducing their overall cost effectiveness.

U.S. Pat. No. 5,409,543 discloses a process for producing a reactive hydrogen species (i.e., atomic hydrogen) using a hot filament to thermally dissociate molecular hydrogen in a vacuum condition. The energized hydrogen chemically reduces the substrate surface. The temperature of the hot filament may range from 500° C. to 2200° C. Electrically biased grids are used to deflect or capture excess free electrons emitted from the hot filament. The reactive species or atomic hydrogen is produced from mixtures containing 2% to 100% hydrogen in an inert carrier gas.

U.S. Pat. No. 6,203,637 discloses a process for activating hydrogen using the discharge from a thermionic cathode. Electrons emitted from the thermionic cathode create a gas phase discharge, which generates active species. The emission process is performed in a separate or remote chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, 6,089,445, 6,021,940, 6,007,637, 5,941,448, 5,858,312 and 5,722,581 describe processes for producing activated $H_2$ (or other reducing gases, such as $CH_4$ or $NH_3$) using electrical discharge. The reducing gas is generally present at "percent levels" in an inert carrier gas ($N_2$). The discharge is produced using an alternating voltage source of "several kilovolts". Electrons emitted from electrodes in a remote chamber produce exited or unstable species that are substantially free of electrically charged species, which are then flowed to the substrate. The resulting processes reduce oxides on the base metal to be soldered at temperatures near 150° C. However, such remote discharge chambers require significant equipment costs and are not easily retrofitted to existing soldering conveyor belt systems. In addition, these processes are typically employed for pre-treating the metal surface before soldering rather than removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals—a plasma containing atomic hydrogen—which then pass through openings in a dielectric shield placed over the oxidized substrate. The dielectric shield concentrates the active hydrogen onto those specific surface locations requiring de-oxidation. However, such dielectric shields can accumulate surface charge that may alter the electric field and inhibit precise process control. The described process is only used to flux base metal surfaces.

Accordingly, there is a need in the art to provide an economical and efficient process for fluxless reflow of solder bumped wafer under relatively low temperatures to reduce thermal energy. There is a further need in the art to provide a process and apparatus for fluxless solder reflow under near ambient or atmospheric pressure conditions to avoid the expense of purchasing and maintaining vacuum equipment. There is an additional need in the art to provide a fluxless solder reflow process using a non-flammable gas environment. Further, there is a need in the art to remove metal oxides from the surface of substrates, such as, for example, electrically insulated substrates. Examples of electrically insulated substrates include, but are not limited to, rigid epoxy glass laminate substrates; flexible polymeric films (e.g., polyimide); insulated substrates used in integrated circuit (IC) interconnection schemes; insulated substrates used in three-dimensional or stacked IC packaging technologies; and combinations thereof.

BRIEF SUMMARY OF THE INVENTION

The method and apparatus described herein satisfies some, if not all, of the needs of the art by providing an apparatus and method for removing metal oxides from the surface of a substrate without the use of a flux. In one aspect, there is provided, a method of removing a metal oxide from a treating surface of a substrate, the method comprising: providing a substrate which is proximal to a base electrode having a grounded electrical potential, the substrate comprising a treating surface comprising the metal oxide; providing an energizing electrode that is proximal to the base electrode and the substrate, wherein at least a portion of the treating surface is exposed to the energizing electrode and wherein the base electrode and the energizing electrode and the substrate reside within a target area.

In another aspect, the energizing electrode is defined by an electrically insulated plate comprising an array of protruding conductive tips, wherein the conductive tips are electrically connected by a conductive wire, wherein the array of protruding tips is separated into a first electrically connected group and a second electrically connected group wherein one of the first or second electrically connected group is connected to a DC voltage source that is positively biased and the other of the first or second electrically connected group is connected to a DC voltage source that is negatively biased, and wherein the DC voltage source that is positively biased and the DC voltage source that is negatively biased are electrically connected to a functional controller that is capable of alternating a supply of energy between the DC voltage source that is negatively biased and the DC voltage source that is positively biased; passing a gas mixture comprising a reducing gas through the target area; energizing the rows of conductive tips by activating the DC voltage source that is negatively biased to generate electrons within the target area, wherein at least a portion of the electrons attach to at least a portion of the reducing gas thereby forming a negatively charged reducing gas; contacting the treating surface with the negatively charged reducing gas to reduce the metal oxides on the treating surface of the substrate; and energizing the rows of conductive tips by activating the DC voltage source that is positively biased to retrieve excess electrons from the treating surface, wherein the rows of conductive tips electrically connected to the DC voltage source that is negatively biased and the rows of conductive tips electrically connected to the DC voltage source that is positively biased are not energized at the same time.

In further aspect, the energizing electrode is defined by a chamber having an internal volume, a gas inlet, and an electrically insulated base that contains an array of downward protruded conductive tips, wherein the conductive tips are made of hypodermic needles, wherein each hypodermic needle has a fluid communication with the internal volume of the gas chamber, so that a gas mixture comprising a reducing gas flowing into the chamber can be injected out from each hypodermic needle, wherein the hypodermic needles are all electrically connected together by a conductive wire and then connected to a negatively biased DC voltage source, so that electrons can be generated from each hypodermic needle tip, wherein at least a portion of the electrons attach to at least a portion of the reducing gas that following out from each hypodermic needle tip thereby forming a negatively charged reducing gas; contacting the treating surface with the negatively charged reducing gas to reduce the metal oxides on the treating surface of the substrate; wherein the substrate is electrically conductive and grounded, so that negatively charged electrons can drain from the substrate to the ground.

In yet another aspect, the energizing electrode is defined by a chamber having an internal volume, a gas inlet, and an electrically insulated base that contains an array of downward protruded conductive tips, wherein the conductive tips are separated into a first electrically connected group and a second electrically connected group, wherein at least one of the first or second electrically connected group of the conductive tips comprises has a fluid communication with the internal volume of the gas chamber, so that a gas mixture comprising a reducing gas flowing into the chamber can be injected out from each hypodermic needle, wherein the at least one group of the hypodermic needles is connected to a DC voltage source that is negatively biased and the other of the first or second electrically connected group is connected to a DC voltage source that is positively biased, and wherein the DC voltage source that is negatively biased and the DC voltage source that is positively biased are electrically connected to a functional controller that is capable of alternating a supply of energy between the DC voltage source that is negatively biased and the DC voltage source that is positively biased; flowing a gas mixture comprising a reducing gas through the gas chamber and through each hypodermic needle; energizing the at least one group of the hypodermic needles by activating the DC voltage source that is negatively biased, so that electrons can be generated from each hypodermic needle tip, wherein at least a portion of the electrons attach to at least a portion of the reducing gas that following out from each hypodermic needle tip thereby forming a negatively charged reducing gas; contacting the treating surface with the negatively charged reducing gas to reduce the metal oxides on the treating surface of the substrate; and energizing the other group of conductive tips by activating the DC voltage source that is positively biased to retrieve excess electrons from the treating surface, wherein the at least one group of hypodermic needles electrically connected to the DC voltage source that is negatively biased and the other group of conductive tips electrically connected to the DC voltage source that is positively biased are not energized at the same time.

BRIEF DESCRIPTION OF SEVERAL VIEWS OF THE DRAWINGS

FIGS. 1a and 1b illustrate a voltage pulse on an emission and a base electrode, respectively;

FIG. 3 provides an example of one embodiment of the electrode suitable for emission and/or retrieval of electrons employing a plurality of tips;

FIG. 4 provides an example of one embodiment of the electrode suitable for emission and/or retrieval of electrons having a segmented assembly;

DETAILED DESCRIPTION OF THE INVENTION

Figure 2A:
FIGS. 2a through 2i is a schematic illustration of various electrode geometries suitable for emission and/or retrieval of electrons.
Figure 2B:
Figure 2C:
Figure 2D:
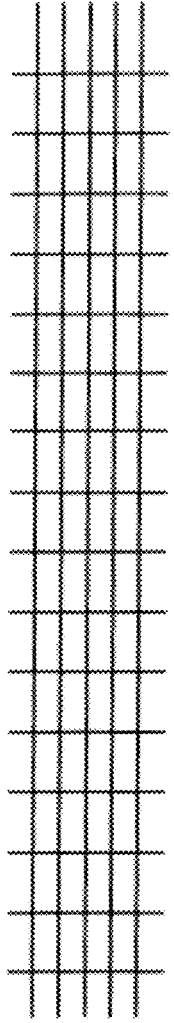
Figure 2E:
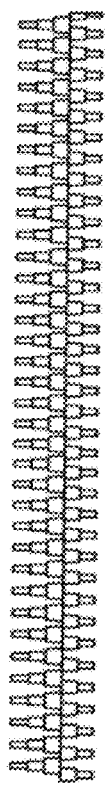
Figure 2F:
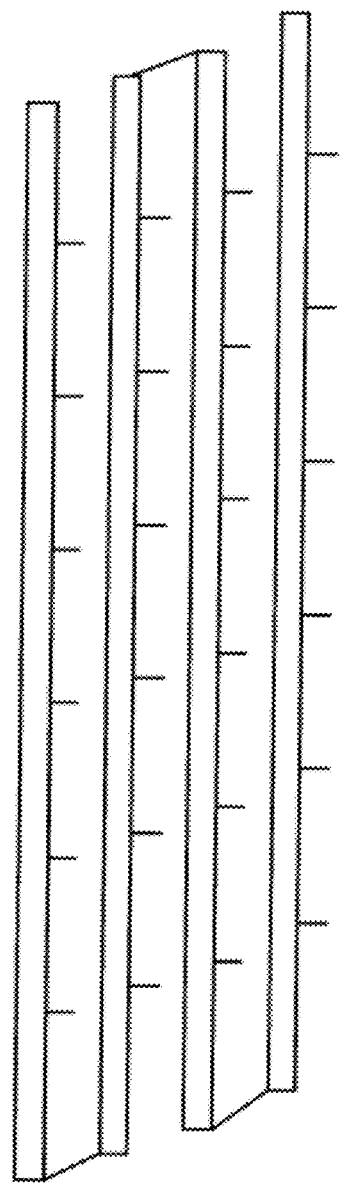
Figure 2G:
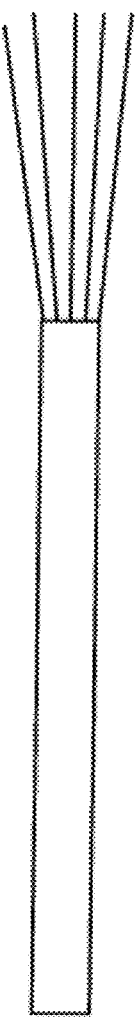
Figure 2H:
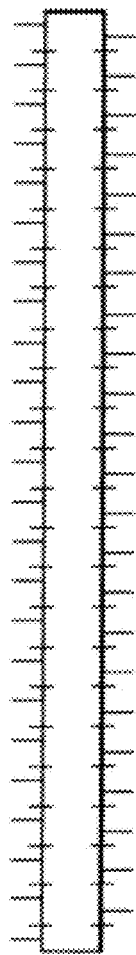
Figure 2H:
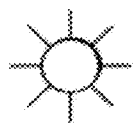
Figure 2I:
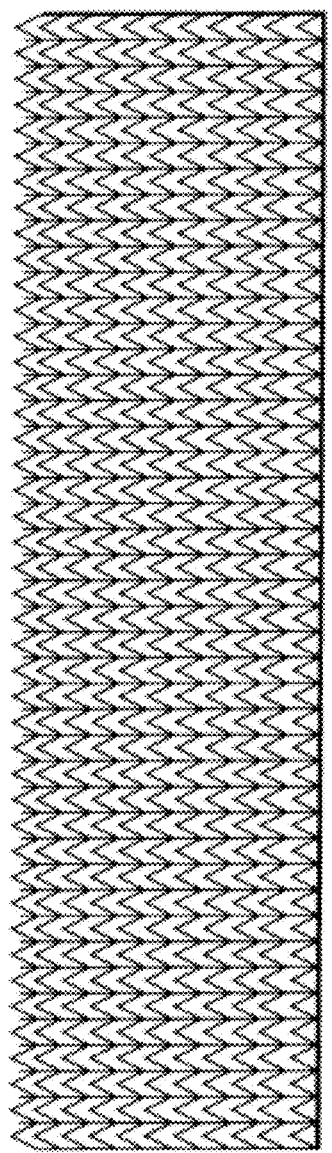

Described herein is a method and apparatus for the removal of metal oxides from a substrate surface by exposure to negatively charged ions. The negatively charged ions react and reduce the surface metal oxides. In one aspect, the method, apparatus, or both can be employed by modifying traditional reflow and soldering equipments such as, for example, the reflow machine used for reflow of solder bumped wafer. In this or other aspects, the method can also be applied to other processes wherein the removal of the surface metal oxides from a substrate is desired such as, but not limited to, metal plating (i.e., the solder plating of portions of printed circuit boards or metal surfaces to make them more amenable to subsequent soldering), reflow and wave soldering for outer lead bonding, surface cleaning, brazing, welding, and removing surface oxides of metals, such as copper oxide, formed during silicon wafer processing. The removal of metal oxides using the method and apparatus described herein is equally applicable to the aforementioned processes or any other process desirous of removing oxides without the need for organic fluxes.

The term "substrate" as used herein generally relates to a material such as silicon, silicon coated with silicon dioxide, aluminum-aluminum oxide, gallium arsenide, ceramic, quartz, copper, glass, epoxy, or any material suitable for use within an electronic device. In certain embodiments, the substrate is an electrically insulated or semi-conductive substrate having solder disposed thereupon. Exemplary solder compositions include, but are not limited to, a fluxless tin-silver, a fluxless tin-silver-copper, a fluxless tin-lead, or a fluxless tin-copper. In one embodiment, the substrate is an electrically insulated substrate. Examples of electrically insulated substrates include but are not limited to the following: rigid epoxy glass (e.g., FR-4 type) laminate substrates used for printed circuit board: flexible polymeric films (e.g., polyimide) substrates used for flexible circuit; insulated substrates used in integrated circuit interconnection schemes, high density interconnects such as polymeric based BGA's, high density interconnects, and the like; insulated substrates used in 3-D or stacked integrated circuit or 3-D or stacked packaging technologies; and combinations thereof. However, the method and apparatus described herein is suitable for a variety of different substrates and solder compositions. In a certain preferred embodiment, the substrate is a silicon wafer having a plurality of solder bumps disposed thereupon.

While not wishing to be bound by theory, it is believed that when an energy source such as a direct current voltage source is applied between at least two electrodes, electrons are generated from one of the two electrodes having a negative electrical bias relative to the other electrode (referred to herein as an "emission electrode") and/or the gas phase between the two electrodes. The generated electrons drift toward the other electrode, which is grounded or has a positive electrical bias (referred to herein as a "base electrode"), along the electric field. The substrate having a plurality of solder bumps upon its surface is placed within the area defined by the base and the emission electrodes (referred to herein as the "target area") with the solder-bumped surface or treating area exposed to the emission electrode. In certain embodiments, the substrate may be connected to the base electrode forming a target assembly. A gas mixture comprising a reducing gas and optionally a carrier gas is passed through the electric field generated by the electrodes. During the electron drift, part of the reducing gas forms negative ions by electron attachment which then drift to the target assembly, i.e., the base electrode and substrate surface. On the substrate surface, negatively charged ions can thus reduce the existing metal oxides without the need for traditional fluxes. Further, the adsorption of the active species on the surface to be treated can be promoted due to the drifting of the negatively charged ions along the electric field.

In embodiments wherein the reducing gas comprises hydrogen, it is believed that the method of the present invention occurs as follows:

Dissociative Attachment of Molecular $H_2$:
$H_2 + e' \Rightarrow H^- + H$     (I)

Electron Attachment on Hydrogen Atom: $e' + H \Rightarrow H^-$     (II)

The combination of (I) and (II): $2e' + H_2 \Rightarrow 2H^-$     (III)

Oxide Reduction: $2H^- + MO \Rightarrow M + H_2O + 2e'$
(M=solder/base metal)     (IV)

In these embodiments, the activation energy of metal oxide reduction using the electron attachment method of the present invention is lower than methods that use molecular hydrogen because the formation of atomic hydrogen ions with electron attachment eliminates the energy associated with bond breaking of molecular hydrogen.

In certain embodiments, energy is supplied to at least one of the electrodes, preferably the emission electrode, sufficient to cause the emission electrode to generate electrons. The energy source is preferably an electric energy or voltage source, such as an AC or DC source. Other energy sources, such as an electromagnetic energy source, a thermal energy source, or a photo energy source may also be used alone, or in combinations with any of the aforementioned energy sources. In certain embodiments of the present invention, the emission electrode is connected to a first voltage level and the base electrode is connected to a second voltage level. The difference in the voltage levels creates a bias in electrical potential. One of the first or the second voltage levels may be zero indicating that either of the two electrodes can be grounded.

To produce negatively charged ions by electron attachment, a large quantity of electrons needs to be generated. In this connection, the electrons can be generated by a variety of ways such as, but not limited to, cathode emission, gas discharge, or combinations thereof. Among these electron generation methods, the selection of the method depends mainly on the efficiency and the energy level of the electrons generated. For embodiments wherein the reducing gas is hydrogen, electrons having an energy level approaching 4 eV is preferred. In these embodiments, such low energy level electrons are preferably generated by cathode emission rather than gas discharge. The generated electrons may then drift from the emission electrode toward the base electrode which creates a space charge. The space charge provides the electron source for generating the negatively charged hydrogen ions by electron attachment when hydrogen passes through the at least two electrodes or within the target area.

For embodiments involving electron generation through cathode emission, these embodiments may include: field emission (referred to herein as cold emission), thermal emission (referred to herein as hot emission), thermal-field emission, photoemission, and electron or ion beam emission.

Field emission involves applying an electric field with a negative bias on the emission electrode relative to the base electrode that is sufficiently high in intensity to overcome an energy barrier for electrons to be generated from the surface of the emission electrode. In certain preferred embodiments, a DC voltage is applied between the two electrodes that ranges from 0.1 to 50 kV, preferably ranging from 2 to 30 kV. In these embodiments, the distance between the electrodes may range from 0.1 to 30 cm, preferably from 0.5 to 5 cm.

Thermal emission, on the other hand, involves using a high temperature to energize electrons in the emission electrode and separate the electrons from the metallic bond in the material of the emission electrode. In certain preferred embodiments, the temperature of the emission electrode may range from 800 to 3500° C., preferably from 800 to 1500° C. The emission electrode may be brought to and/or maintained at a high temperature by a variety of methods such as, but not limited to, directly heating by passing AC or DC through the electrode; indirect heating such as contacting the cathode surface with an electrically insulated hot surface heated by a heating element, IR radiation, or combinations thereof.

Thermal-field emission is a hybrid of field emission and thermal emission methods for electron generation in which both an electric field and a high temperature are applied. Therefore, thermal-field emission may require a lesser electric field and a lower electrode temperature for generating the same quantity of electrons as compared with pure field emission and pure thermal emission. Thermal-field emission can minimize difficulties encountered with pure field emission, such as the tendency of degradation in electron emission by contamination on the emission surface, and a high restriction on the planarity and uniformity of the emission surface. Further, thermal-field emission may also avoid problems related to thermal emission such as a high potential of chemical reaction between the emission electrode and the gas phase. In embodiments wherein the thermal-field emission is used for electron generation, the temperature of the emission electrode can range from ambient to 3500° C., or more preferably from 150 to 1500° C. In these embodiments, the electric voltage can range from 0.01 to 30 KV, or more preferably from 0.1 to 10 KV.

In certain preferred embodiments, the thermal emission or thermal-field emission method is used for electron generation. In these embodiments, a high temperature emission electrode used in either of these methods may also act as a heat source for the gas mixture that is passed through the electric field generated by the two electrodes, so that the thermal energy required for heating the gas for a subsequent reflow process step can be reduced.

In certain embodiments of the present invention, the electron generation is accomplished via a combination of cathode emission and corona discharge methods. In these embodiments, an energy source such as a DC voltage is applied between the two electrodes and electrons may be generated from both the emission electrode (cold or hot) and the gas phase (corona discharge) near the emission electrode. The corona discharge is preferably minimized in order to increase the efficiency of forming negatively charged ions by electron attachment and increase the lifetime of the emission electrode.

In embodiments wherein the cathode emission mechanism is used for electron emission, the voltage applied across the two electrodes may be constant or pulsed. The frequency of the voltage pulse ranges from 0 to 100 kHz. FIGS. 1a and 1b provide an illustration of a voltage pulse on an emission electrode and a base electrode, respectively. In these embodiments, it is believed that a pulsed voltage, such as that shown in FIGS. 1a and 1b, is preferable to constant voltage to improve the amount of electron generation and to reduce the tendency of gas phase discharge.

For embodiments involving electron generation through gas discharge, these embodiments may include thermal discharge, photo-discharge, and various avalanche discharge, including glow discharge, arc discharge, spark discharge, and corona discharge. In these embodiments, electrons are generated by gas phase ionization. The gas phase is a gas mixture comprising the reducing gas and an inert gas. In certain embodiments of gas phase ionization, a voltage source is applied between two electrodes and electrons may be generated from the inert gas within the gas mixture between the two electrodes that then drift toward the positively biased electrode such as the base electrode. During this electron drift, some of these electrons may attach on the reducing gas molecules and form negatively charged ions by electron attachment. In addition, some positive ions are also created in the inert gas that then drift toward the negatively biased electrode such as the emission electrode and are neutralized at the electrode surface.

As mentioned previously, electrons can be generated from an emission electrode when it has a negative bias relative to a base electrode. Referring to FIGS. 2a through 2i, the emission electrode may have a variety of geometries, such as, for example, a thin wire 2a, a rod with a sharpened tip 2b, a rod with several sharpened tips or comb 2c, a screen or wire mesh 2d, a loose coil 2e, an array of combs 2f, a bundle of thin wires or filament 2g, a rod with sharp tips protruding from its surface 2h, or a plate with a knurled surface 2i. Additional geometries may include combinations of the above geometries such as plates or rods with surface protrusions, rods wrapped with wire windings or filament, coils of thin wires, etc. A plurality of electrodes may be employed that may be arranged in a parallel series or in an intersecting grid. Still further geometries may include a "wagon wheel" geometry wherein a plurality of electrodes is arranged in a radial fashion such as in "spokes" of a wheel. In certain embodiments, such as embodiments wherein field emission is involved, the cathode is preferably made of geometries having a large surface curvature, such as a plurality of sharp tips to maximize the electric field near the electrode surface such as the geometry depicted in FIG. 3. As FIG. 3 illustrates, electrode 1 has a series of thin wires 2 that reside within grooves on the electrode surface along with a plurality of tips 3 emanating from its surface.

The electrode material that acts as an emission electrode is preferably comprised of a conductive material with relatively low electron-emission energy or work function. The material preferably also has a high melting point and relatively high stability under processing conditions. Examples of suitable materials include metals, alloys, semiconductors, and oxides coated or deposited onto conductive substrates. Further examples include, but are not limited to, tungsten, graphite, high temperature alloys such as nickel chromium alloys, and metal oxides such as $BaO$ and $Al_2O_3$ that are deposited onto a conductive substrate.

The electrode that acts as a base electrode is comprised of a conductive material such as a metal or any of the other materials described therein. The base electrode can have a variety of different geometries depending upon the application.

In certain embodiments of the present invention involving thermal-field emission, the emission electrode may comprise a segmented assembly such as the electrode depicted in FIG. 4. In this regard, the core 10 of the emission electrode may be made of a metal with a high electrical resistance. A plurality of tips 11 emanate from core 10. Tips 11 may be made of a conductive material with relatively low electron emission energy or work function such as any of the materials disclosed herein. The core may be heated by directly passing an AC or a DC current (not shown) through core 10. The thermal conduction will transfer the heat from the core to tips 11. The hot core 10 and the plurality of tips 11 are enclosed within an enclosure 12 which is then inserted into a support frame thereby forming a segmented assembly as shown. Tips 11 are exposed outside the enclosure 12. Enclosure 12 is composed of an insulating material. The segmented assembly allows for the thermal expansion of the core during operation. In this arrangement, electrons can be generated from hot tips 11 by applying a negative voltage bias on the emission electrode relative to the base electrode.

In another preferred embodiment of the present invention involving thermal-field emission, indirect heating can raise the temperature of the emission electrode. This may be accomplished by using a heating cartridge as the core of the emission electrode. The surface of the heating cartridge may be comprised of an electrically conductive material such as a metal that is electrically insulated from the heating element inside the cartridge. To promote electron emission, a plurality of distributed emission tips can be mounted on the surface of the heating cartridge. The cartridge can be heated by passing an AC or DC current through the heating element inside the cartridge. Electrons can be generated from the distributed tips of the cartridge by applying a negative voltage bias on the surface of the cartridge relative to a second electrode. For creating the voltage bias in this arrangement, the second electrode can be grounded so that the cartridge may be negatively biased or, alternatively, the cartridge can be grounded so that the second electrode may be positively biased. In some embodiments, the latter case may be preferable for eliminating a potential interference between two electric circuits, e.g., one circuit may be the AC or DC current along the heating element, and the another circuit may be the high voltage bias between the surface of the cartridge and the second electrode. In these embodiments, the hot cartridge electrode may also act as a heat source for the gas mixture to achieve the required temperatures for the reflow process step.

As mentioned previously, a gas mixture comprising a reducing gas is passed through the electric field generated by the at least two electrodes. The reducing gas contained within the gas mixture may fall within one or more of the following categories: 1) an intrinsically reductant gas, 2) a gas capable of generating active species which form gaseous oxides upon reaction of the active species with the metal oxide, or 3) a gas capable of generating active species which form liquid or aqueous oxides upon reaction of the active species with the metal oxide.

The first category of gases, or an intrinsically reductant gas, includes any gas that thermodynamically acts as a reductant to the oxides to be removed. Examples of intrinsically reductant gases include $H_2$, CO, $SiH_4$, $Si_2H_6$, formic acid, alcohols such as, for example, methanol, ethanol, etc., and some acidic vapors having the following formula (III):

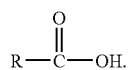
(III)

In formula (III), substituent R may be an alkyl group, substituted alkyl group, an aryl, or substituted aryl group. The term "alkyl" as used herein includes straight chain, branched, or cyclic alkyl groups, preferably containing from 1 to 20 carbon atoms, or more preferably from 1 to 10 carbon atoms. This applies also to alkyl moieties contained in other groups such as haloalkyl, alkaryl, or aralkyl. The term "substituted alkyl" applies to alkyl moieties that have substituents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$(R=alkyl $C_{1-10}$ or aryl $C_{6-10}$); or $NR_2$ (R=H, alkyl $C_{1-10}$ or aryl $C_{6-10}$). The term "halogen" as used herein includes fluorine, chlorine, bromine, and iodine. The term "aryl" as used herein includes six to twelve member carbon rings having aromatic character. The term "substituted aryl" as used herein includes aryl rings having substitutents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$(R=alkyl $C_{1-10}$ or aryl $C_{6-10}$); or $NR_2$ (R=H, alkyl $C_{1-10}$ or aryl $C_{6-10}$). In certain preferred embodiments, the gas mixture contains hydrogen.

The second category of reducing gas includes any gas that is not an intrinsically reductive but can generate active species, such as, for example, H, C, S, H', C', and S', by dissociative attachment of electron on the gas molecules and form gaseous oxides by reaction of the active species with the metal oxides to be removed. Examples of this type of gas include: $NH_3$, $H_2S$, $C_1$ to $C_{10}$ hydrocarbons such as but not limited to $CH_4$, $C_2H_4$, acidic vapors having the formula (III), and organic vapors having the following formula (IV):

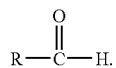
(IV)

In formulas (III) and (IV), substituent R may be an alkyl group, substituted alkyl group, an aryl, or substituted aryl group.

The third category of reducing gas includes any gas that is not an intrinsically reductive but can form active species, such as, for example, F, Cl, F', and Cl', by dissociative attachment of electron on the gas molecules and form liquid or aqueous oxides by reaction of the active species with the metal oxides. Examples of this type of gas include fluorine and chlorine containing gases, such as $CF_4$, $SF_6$, $CF_2Cl_2$, HCl, $BF_3$, $WF_6$, $UF_6$, $SiF_3$, $NF_3$, $CClF_3$, and HF.

Besides including one or more of the above categories of reducing gases, the gas mixture may further contain one or more carrier gases. The carrier gas may be used, for example, to dilute the reducing gas or provide collision stabilization. The carrier gas used in the gas mixture may be any gas with an electron affinity less than that of the reducing gas or gases within the gas mixture. In certain preferred embodiments, the carrier gas is an inert gas. Examples of suitable inert gases include, but are not limited to, $N_2$, Ar, He, Ne, Kr, Xe, and Rn.

In certain preferred embodiments, the gas mixture comprises hydrogen as the reducing gas and nitrogen as the carrier gas due to its relatively lower cost and the environmental friendliness of the exhaust gas release. In these embodiments, the gas mixture comprises from 0.1 to 100% by volume, preferably 1 to 50% by volume, or more preferably from 0.1 to 4% by volume of hydrogen. Amounts of hydrogen lower than 4% are preferred, which makes gas mixture non-flammable.

In certain embodiments, the gas mixture is passed through the field generated by the at least two electrodes at a temperature ranging from ambient to 450° C., more preferably ranging from 100 to 350° C. The pressure of the gas mixture is preferably ambient atmospheric pressure, i.e., the existing pressure of the area of the process. No special pressure, such as vacuum, may be required. In embodiments where the gas mixture is pressurized, the pressure may range from 10 to 20 psia, preferably from 14 to 16 psia.

The substrate surface in which the oxides are to be removed is preferably located between the emission electrode and the base electrode with the surface facing the emission electrode. In certain preferred embodiments of the present invention, the substrate may be connected to the base electrode to provide a target assembly and facing the emission electrode. In these embodiments, the distance between the emission electrode and the top surface of the wafer/target assembly may range from 0.1 to 30 cm, preferably from 0.5 to 5 cm.

Figure 5:
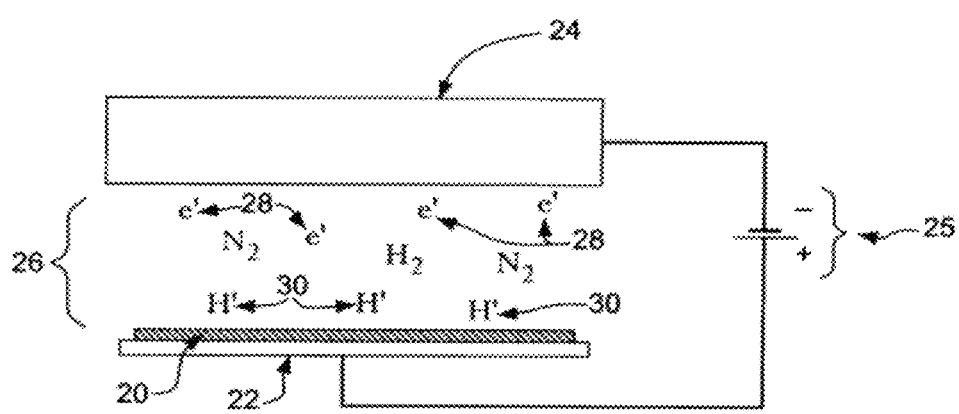
FIG. 5 provides an example of one embodiment of the method described herein illustrating removal of surface metal oxides in a wafer bumping application.

FIG. 5 provides an illustration of the process used for a wafer bumping application wherein the substrate is silicon wafer 20. Referring to FIG. 5, a second electrode 24 is located above a wafer 20, and the wafer 20 comprising a plurality of solder bumps (not shown) is placed upon a first electrode 22 to form a target assembly. At least a portion of the surface of wafer 20 containing the plurality of solder bumps is exposed to second electrode 24. While the wafer 20 is shown as being placed upon first electrode 22, it is envisioned that the wafer 20 can be placed anywhere between electrodes 22 and 24. A pulsed voltage 25 is applied across the first electrode 22 and the second electrode 24 to generate an electric field. A gas mixture 26 containing hydrogen and nitrogen is passed through the electric field. Low energy electrons 28 are generated within the electric field which drift towards the first electrode 22 and wafer 20 disposed thereupon. In addition, a portion of the hydrogen within gas mixture 26 forms hydrogen ions 30 by electron attachment which also drift towards the first electrode 22 and wafer 20 disposed thereupon. The drift of negatively charged hydrogen ions 30 and electrons 28 towards the electrode 22 with wafer 20 disposed thereupon promotes adsorption of ions 30 onto the surface of wafer 20 and fosters de-oxidation of the wafer surface (referred to herein as surface de-oxidation).

Depending upon the conductivity of the substrate, some of the electrons that are generated as a reaction byproduct from surface de-oxidation can accumulate on the substrate surface. In addition, a portion of the free electrons can directly adsorb on the substrate due to the drifting along the electric field.

This electron build-up on the substrate surface may prevent additional adsorption of the negatively charged ions as well as adversely affect the equilibrium of the surface de-oxidation. To make the surface de-oxidation process more efficient, the electrons on the substrate surface need to be periodically removed.

Figure 6:
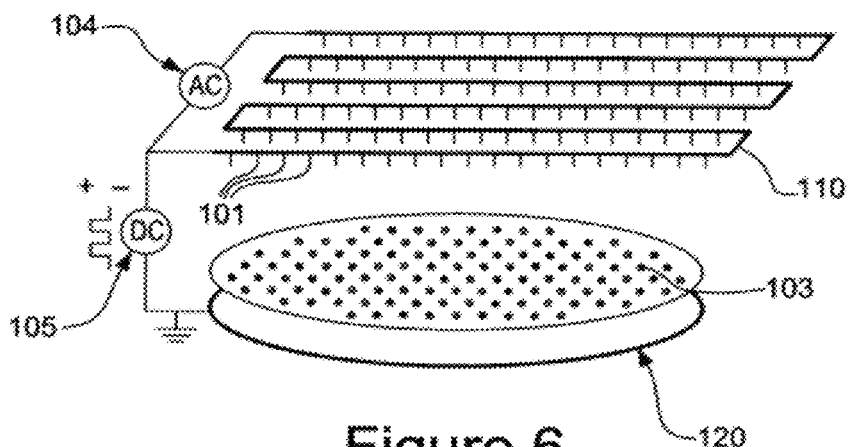
FIG. 6 illustrates a particular embodiment of the method described herein for removing negatively charged ions on the substrate surface by changing the electrode polarity during the reflow of wafer bumps.
Figure 7A:
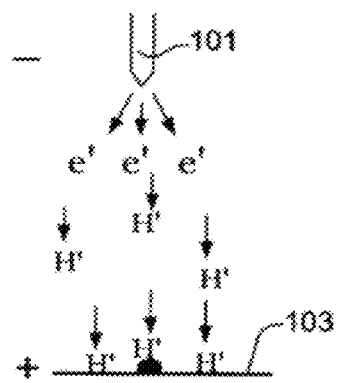
FIGS. 7a and 7b illustrates the transportation of the charged species between two electrodes when the polarity of the two electrodes is changed.
Figure 7B:
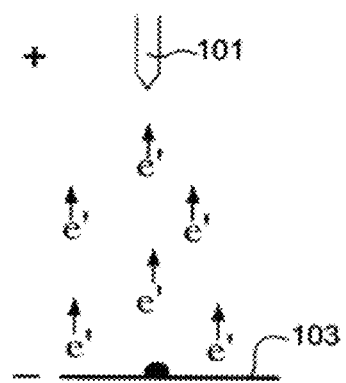
Figure 10A:
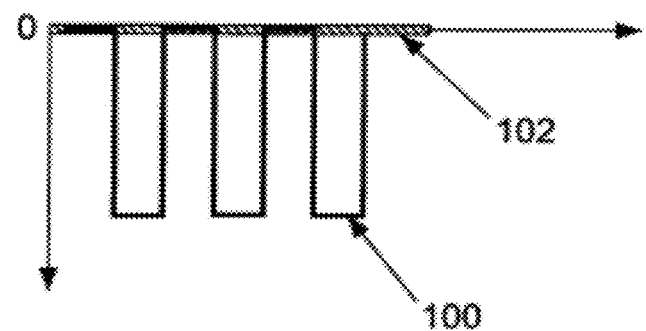
FIGS. 10a and 10b provide an illustration of a unidirectional voltage pulse and a bi-directional voltage pulse, respectively.
Figure 10B:
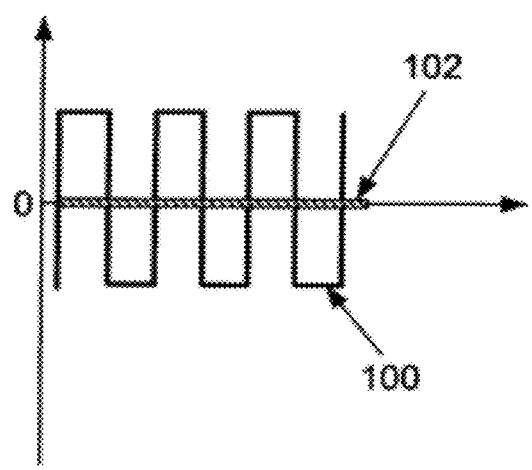

One method to remove the electrons on the substrate surface may be to change the polarity of both of the electrodes relative to each other. During the polarity change, the voltage level on each electrode may not necessarily be the same. In one embodiment, the polarity change can be achieved by applying a bi-directional voltage pulse between at least two electrodes such as that shown in FIG. 10*b*. FIG. 6 provides an example of a polarity change wherein an electrode may generate electrons in one phase of the voltage pulse (i.e., a negative bias) and retrieve electrons in another phase of the voltage pulse (i.e., a positive bias). In FIG. 6, electrode 110 is used as both the electron emission and electron retrieving electrode and electrode 120 is used a base electrode. This arrangement allows the efficiency of surface de-oxidation to be maximized. Electrode 110 containing a plurality of sharp tips 101 is located above wafer 103. Electrode 110 is heated by connecting to an AC power source 104. Another electrode 120 is located underneath wafer 103. The change in polarity of electrodes 110 and 120 can be obtained, for example, by a bi-directional pulsed DC power 105. An example of bi-directional voltage pulse is illustrated in FIG. 10*b*. When electrode 110 is negatively biased, at least a portion of the electrons generated from tips 101 attach to at least a portion of the reducing gas and newly created reducing gas ions drift towards wafer 103. When the polarity is reversed, electrons are released from the surface of wafer 103 and retrieved back at tips 101. FIGS. 7*a* and 7*b* illustrate the transportation of the charged species during each cycle of the voltage pulse. The frequency of changing the polarity of the two electrodes can range from 0 to 100 kHz.

Figure 8:
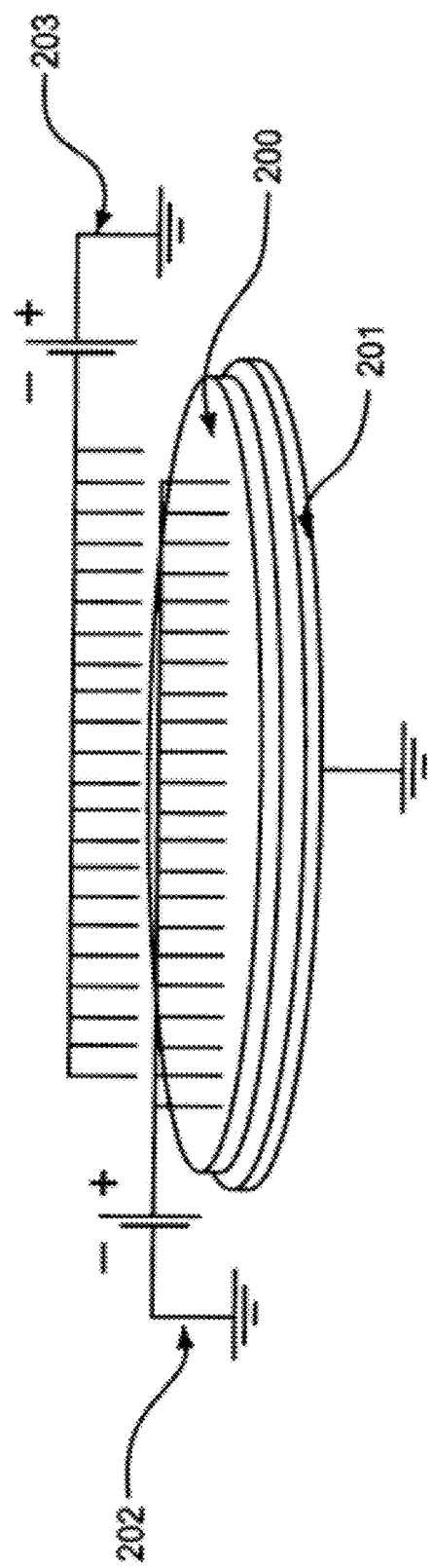
FIG. 8 provides an illustration of a particular embodiment of the method described herein for removing electrons on the surface of a substrate by employing an additional electrode with a positive bias relative to the base electrode.

In an alternative embodiment, excess electrons on the substrate surface may be removed by employing one or more additional electrodes. FIG. 8 provides such an example wherein a wafer is the substrate. Referring to FIG. 8, wafer 200 is disposed upon a grounded base electrode 201. Two electrodes, electrode 202 having a negative voltage bias relative to base electrode 201 and electrode 203 having a positive voltage bias relative to base electrode 201 are installed above the wafer surface 200. In this arrangement, electrons are continually generated from electrode 202 and retrieved at electrode 203. In one particular embodiment, the polarity of electrode 202 and electrode 203 may be periodically changed from a positive to a negative voltage bias, and vice versa, relative to the base electrode 201.

In yet another embodiment, electrons or residual surface charge may be removed from the substrate surface by employing a neutralizer after surface de-oxidation. If left untreated, residual charge contamination can cause electrostatic discharge damage to sensitive electronic components. In these embodiments, flowing a high purity gas such as $N_2$ through a commercially available neutralizer device and then across the substrate surface can neutralize the residual charge on the wafer surface. The positive ions present in the gas will neutralize any residual electrons and provide an electrically neutral surface. Suitable charge neutralizer devices may, for example, consist of Kr-85 radioactive sources that produce equal densities of positive and negative ions in the gas. While positive and negative ions are produced in the gas as it flows through the wafer, the net charge of the gas stream is zero.

In certain embodiments, the substrate or target assembly may be moved with respect to the electrode that acts as an emission electrode. In this regard, the emission electrode may be in a fixed position and the substrate may be moved, the emission electrode may be moved and the substrate may be in a fixed position, or both the emission electrode and the substrate are moved. The movement may be vertical, horizontal, rotational, or along an arc. In these embodiments, surface de-oxidation may then occur within a localized area of the substrate surface.

Figures 9A, 9B:
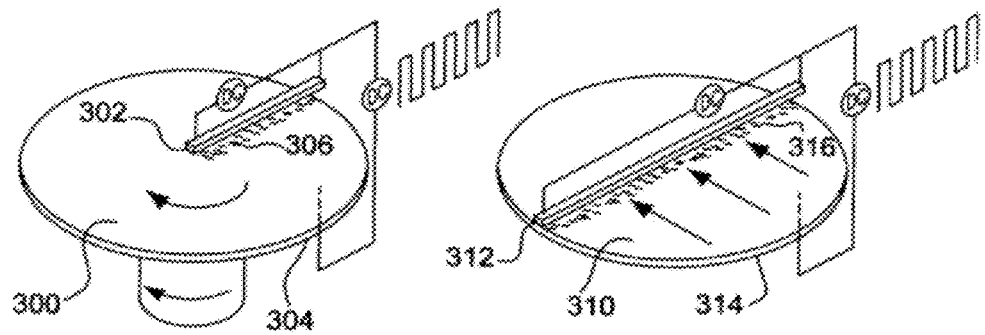
FIGS. 9a through 9e provide various illustrations of particular embodiments of the method and apparatus described herein employing movement of at least one electrode with respect to the substrate.
Figures 9C, 9D:
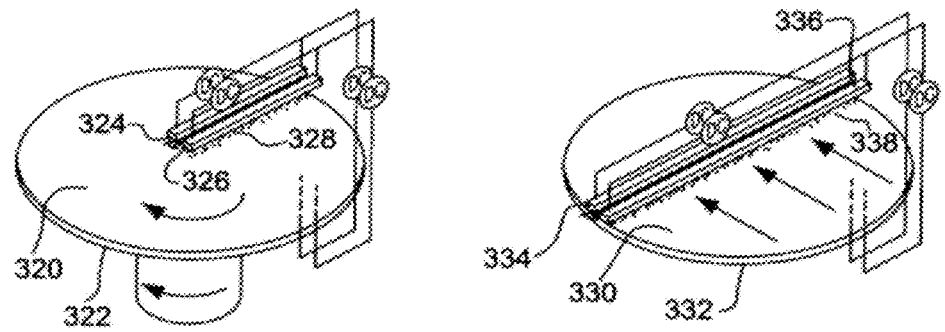
Figure 9E:
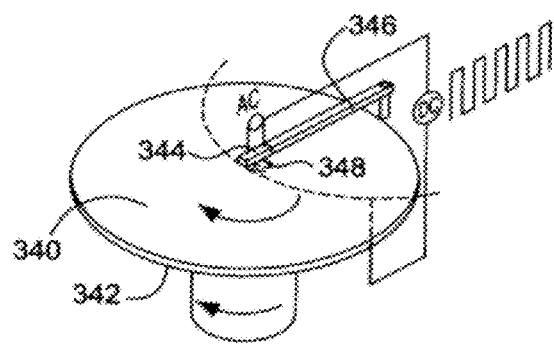

For the following FIGS. 9*a* through 9*e*, the substrate is a silicon wafer that is disposed upon a base electrode, which is grounded. At least portion of the wafer surface comprising a plurality of solder bumps (not shown) is exposed to a second electrode that acts as both an emitting and a retrieving electrode (i.e., changing polarity, for example, from a negative to a positive bias in electrical potential). FIG. 9*a* shows a silicon wafer 300 moved rotationally under a heated linear electrode 302 to which is applied a bi-directionally pulsed voltage relative to the base electrode 304 that may cycled in a frequency range from 0 to 100 KHz thereby generating an ion area shown as 306. A motor located outside the processing chamber (not shown) rotates the wafer. Such rotation is frequently accomplished in semiconductor processing without significant contamination of the wafer surface. Contamination may be avoided by employing high cleanliness, rotational feed-throughs and control of flow patterns. FIG. 9*b* shows a silicon wafer 310 moved linearly under a heated linear electrode 312 to which is applied a bi-directionally pulsed voltage relative to the base electrode 314 thereby generating an ion area shown as 316. This arrangement may be suitable for applications wherein a conveyor belt is used to move wafers through tubular bumping furnaces such as, for example, printed circuit boards through reflow furnaces. FIG. 9*c* shows a silicon wafer 320 moved rotationally under a pair of heated linear emission electrodes 324 and 326: the base electrode 322 has a steady positive bias and the emission electrodes 324 and 326 has a steady negative bias relative to the base electrode 322 so that electrons can be generated to and be retrieved back from the wafer surface thereby generating an ion area shown as 328. A motor located outside the processing chamber (not shown) rotates the wafer. FIG. 9*d* shows a silicon wafer 330 moved linearly under a heated pair of linear electrodes 334 and 336 that are held at steady and opposite polarities relative to the base electrode 332 to conduct electron emission and retrieving separately thereby generating an ion area shown as 338. Lastly, FIG. 9*e* employs a relatively smaller electrode 344 located on the end of a pivoting arm 346. The polarity of the electrode 344 is frequently altered relative to the base electrode 342 thereby generating an ion area shown as 348. The arm is swung over a rotating wafer 340, in for example an arc-like motion, to affect complete and uniform treatment of the entire wafer surface.

The method described herein can be used in several areas of the microelectronics manufacturing in addition to the reflow of a solder bumped wafer such as, for example, surface cleaning, metal plating, brazing, welding, and reflow and wave soldering for outer lead bonding. An example of reflow and wave soldering apparatuses that are suitable for the method described herein is in FIGS. 1-3 provided in pending U.S. application Ser. No. 09/949,580 which assigned to the assignee of the present invention and is incorporated herein by reference it its entirety. In one particular embodiment, the method described herein can be used to reduce surface oxides of metals, such as copper oxide, formed during silicon wafer processing or thin film de-oxidation. Such oxides may form as a result of the various wet processing steps, such as chemical mechanical planarization, that are used to form microelectronic devices on the wafers. These surface oxides reduce device yield and device reliability. The present method allows surface oxides to be removed in a fully dry, environmentally friendly manner that does not require the use of aqueous reducing agents. Further, since the present method is performed at relatively low temperatures, it does not significantly affect the thermal budget of the device during processing. Higher temperatures, by contrast, tend to reduce device yield and reliability by causing diffusion of dopants and oxides thereby reducing device performance. Since the method described herein can—in certain embodiments—be performed on a single wafer, the method can be integrated with other single wafer processes, thereby providing better compatibility with other fabrication steps.

The method and apparatus described herein are particularly suitable for applications of wafer bumping and thin film de-oxidation. The conveniences of using the method and apparatus described herein for wafer bumping and thin film de-oxidation are numerous. First, compared to typical reflow soldering processes for outer lead bonding, wafer bumping and thin film de-oxidation are both single-face treatment. In this connection, the space above the surface to be deoxidized can be as small as 1 cm, thereby resulting in an efficient process for both ion generation and transportation. Second, the processing temperatures for reflow in wafer bumping are significantly higher than that of typical reflow soldering processes. The higher temperatures promote the formation of the negatively charged ions by electron attachment. Third, in wafer bumping and thin film de-oxidation processes, the solder bumps and thin films are completely exposed thereby minimizing any "shadow" effect during surface de-oxidation. Further, compared to other soldering processes whereby the solder has to wet and spread over the component surface, the deposited solder bumps on the wafer need only exhibit solder ball formation upon first reflow.

Figure 11:
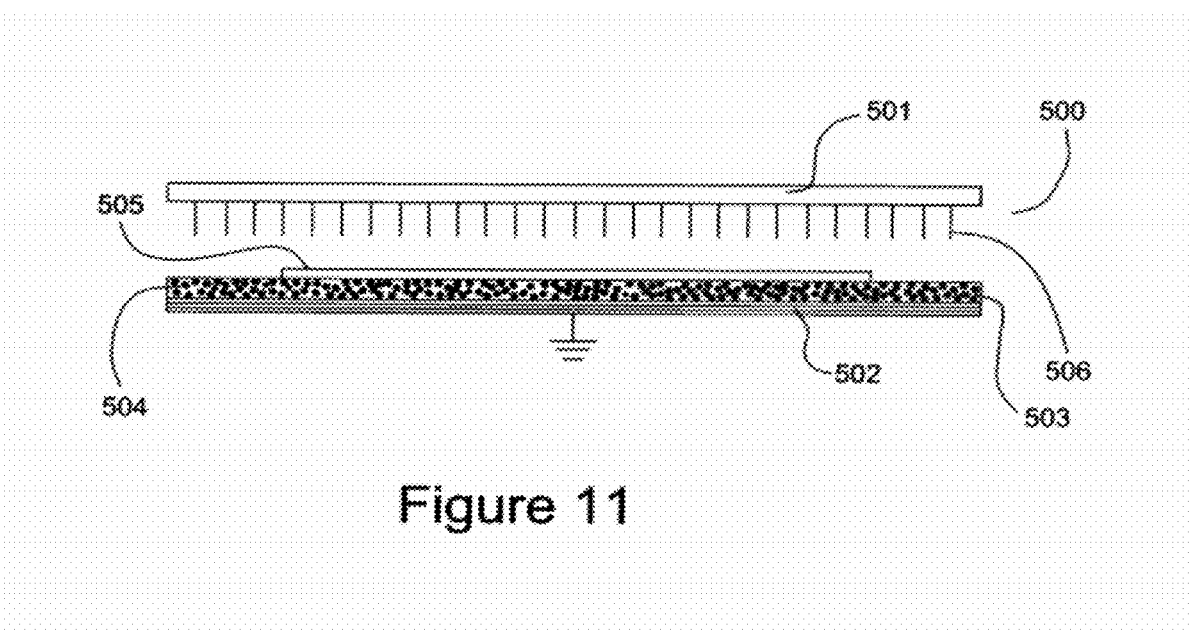
FIG. 11 is an illustration of an electrode assembly embodiment of the present invention.

FIGS. 11 to 14 illustrate a preferred electrode assembly apparatus employed for removing a metal oxide from a treating surface of a substrate according to the present invention. Referring to FIG. 11, electrode assembly comprises energizing electrode 501 having an array of protruding conductive tips 506 that are electrically connected by a conductive wire (not shown), and base electrode 502, which has a grounded electrical potential. As used herein, the term "energizing electrode" refers to an electrode that is an electrode that has an electrical potential—either positive or negative—relative to ground (zero). The energizing electrode 501 is proximal to the base electrode 502. Preferably, the base electrode 502 and the energizing electrode 501 are spaced apart from one another by a distance of from about 0.5 cm to about 5.0 cm. In preferred embodiments, the base electrode 502 and the energizing electrode 501 are spaced apart from one another by a distance of 1.0 cm.

A substrate 503 is proximal to the base electrode 502. Substrate 503 comprises an insulating portion 504 and a treating surface 505 comprising a metal oxide. Preferably, at least a portion of the treating surface 505 is exposed to the energizing electrode 501 and the base electrode 502 and the energizing electrode 501 and the substrate 503 all reside within a target area.

Figures 12A, 12B:
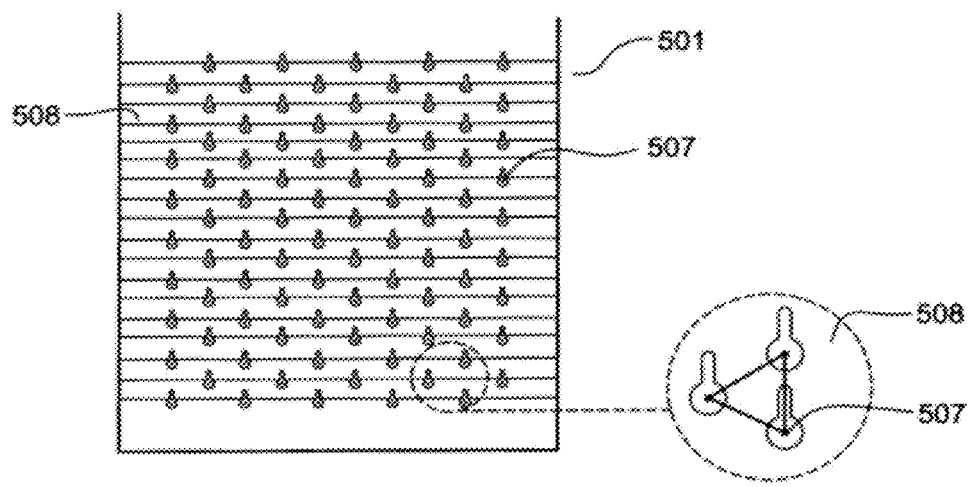
FIGS. 12(a) and 12(b) are illustrations of certain features of the embodiment of FIG. 11.

Referring now to FIGS. 11 and 12(a), energizing electrode 501 is defined by an insulated plate having an array of protruding conductive tips 506 that are electrically connected by a conductive wire (not shown). Preferably, the insulated plate comprises a material selected from insulating materials such as, for example, quartz, a ceramic material, a polymer, and mixtures thereof. In one embodiments, the insulating plate comprises quartz. In another embodiment, the insulating plate comprises a ceramic material.

In one particular embodiment, the protruding conductive tips are removably connected to the base plate. For example, referring to FIG. 12(a), the underside of the insulated plate has holes 507 that resemble "key holes." Each of the holes 507 is connected by a conductive wire 508, which electrically contacts the conductive tips 506 once the conductive tips 506 are inserted into the holes 507. FIG. 12(b) shows a close-up of the arrangement of three of the holes 507. Preferably, the holes 507 (and, thus, the conductive tips 506) are spaced apart from each other by a distance of from about 2 mm to about 10 mm, or from about 5 mm to about 8 mm, or by a distance of about 5 mm. The holes 507 can be formed by any means known to those skilled in the art such as, for example, by laser drilling.

Figure 13:
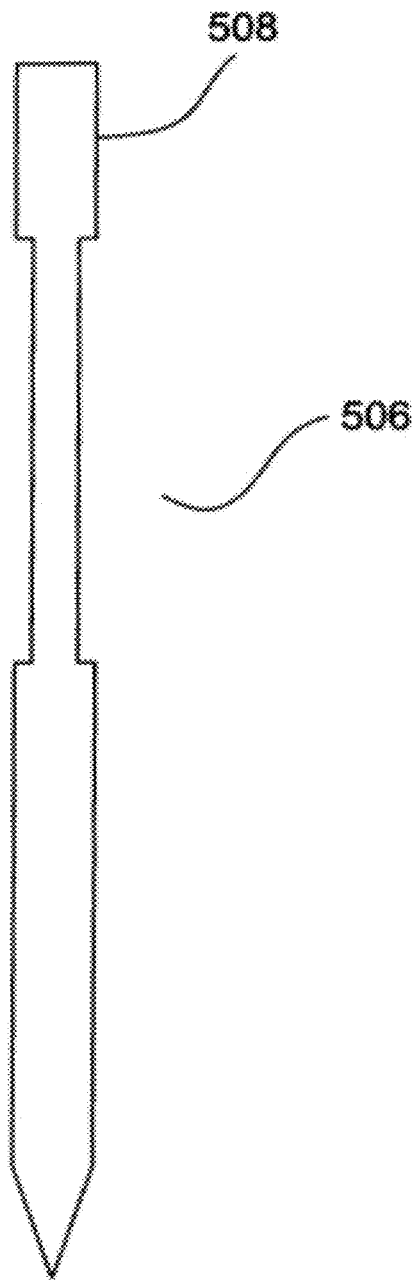
FIG. 13 is an illustration of a conductive tip employed in the embodiment of FIG. 11.

FIG. 13 shows a single conductive tip 506 whose upper end 508 fits into one of the holes 507, contacts conductive wire 508, and locks into place by, for example, a twisting motion. Each of the conductive tips can be unlocked and removed by, for example, a twisting motion in the opposite direction than that used to lock the conductive tip 506 into place. Preferably, conductive tips 506 are formed from metals such as, for example, brass, stainless steel, nickel-chromium alloy, and other metals with relatively low electron-emission energy. In another embodiment, conductive tips 506 can be comprised of nano-tubes such as, for example, carbon nanotubes.

Figure 14:
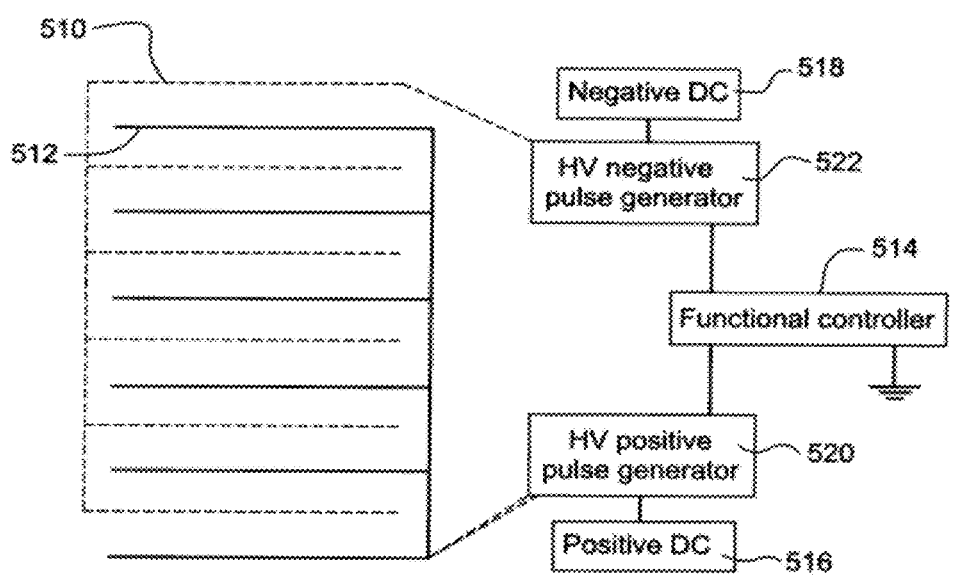
FIG. 14 is a diagram of the electrical arrangement of the conductive tips employed in the embodiment of FIG. 11.

Referring now to the embodiment depicted in FIG. 14, the array of protruding conductive tips 506 separated into a first electrically connected group 510 and a second electrically connected group 512 wherein one of the first or second electrically connected group is connected to a DC voltage source that is positively biased 516 and the other of the first or second electrically connected group is connected to a DC voltage source that is negatively biased 518. The DC voltage source that is positively biased and the DC voltage source that is negatively biased are electrically connected to a functional controller 514 that is capable of alternating a supply of energy between the DC voltage source that is negatively biased and the DC voltage source that is positively biased. Between the functional controller 514 and each of the positive and negative DC voltage sources is a positive pulse generator 520 and a negative pulse generator 522 in communication with the positive and negative DC voltage sources, respectively. The pulse generators 520 and 522 are, in effect, switches. When each pulse generator receives a pulsing signal (e.g., a pulsed low voltage signal of 0 to 5 v) from the functional controller 514, a corresponding high voltage pulse (e.g., between 0 v and the set point of the DC voltage) will be created, which powers the corresponding high voltage source. The functional controller 514 has a dual outputs. When one output is connected to a corresponding pulse generator, the other output is disconnected to the other pulse generator, thus making the alternating function. Typically, there are two adjustable variables of the pulsing signal of the functional controller: pulsing frequency and the on/off ratio of the voltage.

In operation, when a gas mixture comprising a reducing gas is passed through the target area, the functional controller 514, in cooperation with the negative pulse generator 522, energizes the rows of conductive tips by activating the DC voltage source that is negatively biased to generate electrons within the target area, wherein at least a portion of the electrons attach to at least a portion of the reducing gas thereby forming a negatively charged reducing gas that, in turn, contacts the treating surface to reduce metal oxides on the treating surface of the substrate. The functional controller 514 then deactivates the DC voltage source that is negatively biased and, in cooperation with the positive pulse generator 520, activates the DC voltage source that is positively biased to energize the other set of rows of conductive tips to retrieve excess electrons from the treating surface. Preferably, the rows of conductive tips electrically connected to the DC voltage source that is negatively biased and the rows of conductive tips electrically connected to the DC voltage source that is positively biased are not energized at the same time. In operation, functional controller 514 is capable of alternating between the negative and positive biased DC voltage at a high-frequency pulse. In preferred embodiments, the voltage pulsing frequency is preferably from about 0 to about 50 kHz and, more preferably, from about 10 kHz to about 30 kHz. The amplitude of the voltage pulse is preferably from about 1 kV to about 3 kV.

There are several benefits of the embodiment illustrated by FIGS. 11 to 14. First, such embodiment allows for the low temperature reduction of metal oxides such as, for example, copper oxide, on an insulated substrate such as, for example, a ceramic substrate. Examples of insulated substrates include, for example, rigid epoxy glass laminate substrates used for printed circuit boards, flexible flex polymeric films (e.g., polyimide) substrates used for flexible circuits, insulated substrates used in integrated circuit interconnection schemes, high density interconnects such as polymeric based BGA's (Ball Grid Array), high density interconnects, and insulated substrates used in 3-D or stacked integrated circuit or 3-D or stacked packaging technologies. Next, the embodiment illustrated in FIGS. 11 to 14 provides a structure and electrical arrangement that is able to intensify the electrical field on each conductive tip, thereby largely reducing the threshold voltage for a uniform electron emission among the tips without arcing between adjacent tips of opposite voltage potentials. An additional benefit of the method and apparatus described herein is that the thermal expansion of the electrode plate is largely minimized when an insulating material such as quartz or ceramic is used instead of metal, thus the thermal deflection of electrode can be eliminated at elevated temperatures, such as above 300° C. A further additional benefit is that the conductive pins can be removed and replaced from the electrode plate in case of damage or disrepair.

Figure 15:
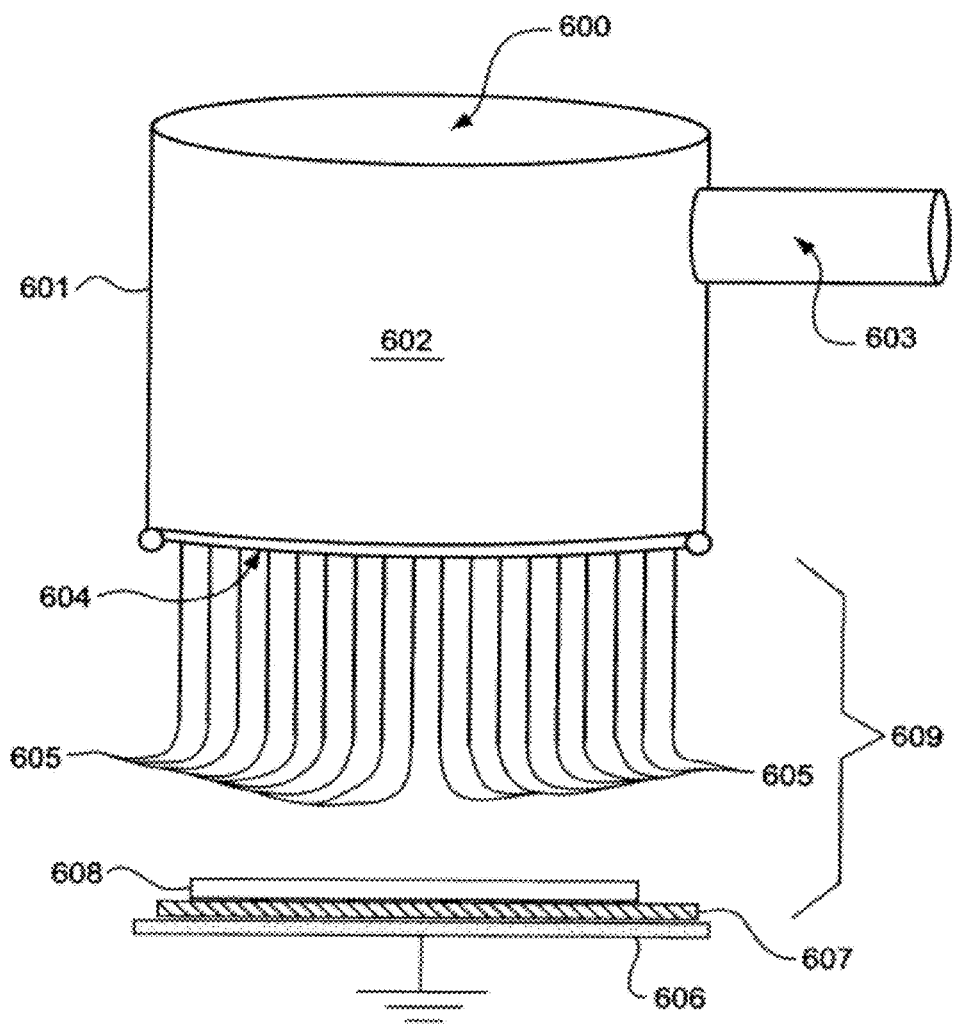
FIG. 15 is an illustration of an embodiment of the energizing electrode assembly described herein.

In another embodiment depicted in FIG. 15, electrode assembly comprises energizing electrode 600 having an array of protruding conductive tips 605 that are electrically connected by a conductive wire (not shown), and base electrode 606, which has a grounded electrical potential. The energizing electrode 600 is proximal to the base electrode 606. At least a portion of the array of protruding conductive tips 605 has an internal passageway (not shown in FIG. 15) that is in fluid communication with the internal volume 602 of chamber 601, so that a gas mixture comprising a reducing gas flowing into the chamber can be injected out from at least a portion of the conductive tips 605 into the target area 609 containing the substrate 607 having a surface to be treated or treating surface 608 that resides within target area 609. In certain embodiments, base electrode 606 and the base plate 604 of energizing electrode 600 are spaced apart from one another by a distance of from about 0.5 cm to about 5.0 cm or, alternatively, are spaced apart from one another by a distance of 1.0 cm.

Figure 16:
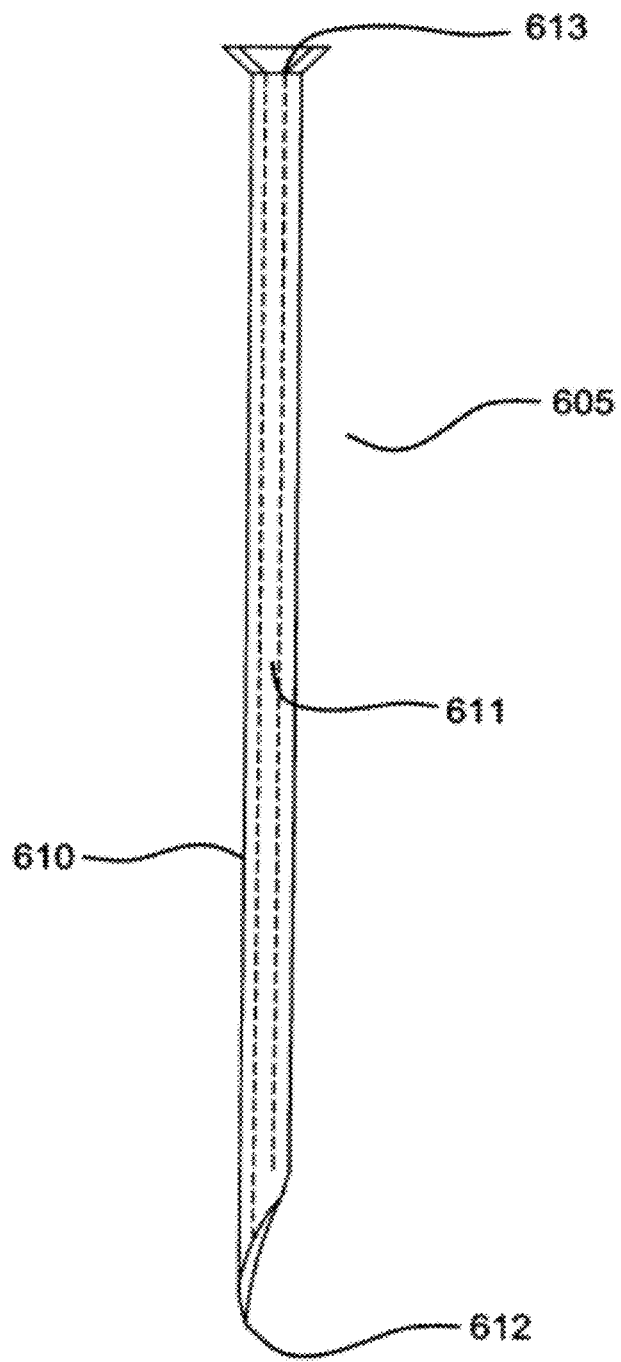
FIG. 16 is an illustration of an embodiment of the conductive tip having an internal passageway therethrough, an angled tip, and a flanged end.

Referring again to FIG. 15, energizing electrode 600 further comprises a chamber 601 having an internal volume 602, a gas inlet 603 in fluid communication with the internal volume 602, and an electrically insulated base plate 604 such as that shown in FIG. 15. While the cross section of insulated base plate 604 is shown as being circular, it is envisioned that other cross sections such as, but not limited to a square, a rectangular, an oval, or combinations thereof can be used. Insulated base plate 604 may comprise a material selected from insulating materials such as, for example, quartz, a ceramic material, a polymer, and mixtures thereof. In one particular embodiment, the insulating base plate 604 comprises quartz. In another particular embodiment, the insulating base plate comprises a ceramic material. Referring again to FIG. 15, energizing electrode 600 further contains an array of protruding conductive tips 605, wherein each conductive tip 605 has an internal passageway (not shown in FIG. 15) that is in fluid communication with the internal volume 602 of chamber 601, so that a gas mixture comprising a reducing gas flowing into the chamber can be injected out from at least a portion of the conductive tips 605 into target area 609. Conductive tips 605 may be comprised of a material that conducts electrons such as but not limited, from metals such as, for example, brass, stainless steel, nickel-chromium alloy, and other materials with relatively low electron-emission energy such as but not limited to, graphite, carbon, carbon nanotubes, FIG. 16 provides a side view of one embodiment of conductive tip 605. As FIG. 16 illustrates, conductive tip 605 has a body 610 comprising an internal passageway 611 (shown in dashed line) that is in fluid communication with internal volume 602 of chamber 601 (shown in FIG. 15) and the treating area 609 (shown in FIG. 15). In operation, at least a portion of the reducing gas may pass through the internal chamber 602 of energizing electrode 601 through the internal passageway 611 into the treating area or target area 609. In the embodiment shown in FIG. 16, conductive tip 605 further comprises a flanged end 613 that has a diameter that is greater than the diameter of the external diameter of the body 610 of conductive tip 605 that allows it be mounted onto the insulating plate 604 of chamber 601 (shown in FIG. 15). In the embodiment shown in FIG. 16, conductive tip 605 also has an angled tip 612 opposite that of flanged end 613. It is anticipated that other geometries for the angled tip 612 of conductive tip 605 may also be used such as, but not limited to, a blunt end, a tapered end, a pyramidal-shaped end, or a conical-shaped end.

In an alternative embodiment, conductive tip 605 can be a conductive wire that is inserted into an tube that is made of an insulating material, a tube made of conductive material, or combination thereof, through which a portion of the reducing gas is passed through the internal volume of the tube into the target area.

In certain embodiments, conductive tips 605 are all electrically connected together by a conductive wire and then connected to a negatively biased DC voltage source, so that electrons can be generated from each conductive needle tip, wherein at least a portion of the electrons attach to at least a portion of the reducing gas that flows out from each conductive tip thereby forming a negatively charged reducing gas. The treating surface is then contacted with the negatively charged reducing gas to reduce the metal oxides on the treating surface. In this or other embodiments, the substrate is electrically conductive and grounded, so that negatively charged electrons can drain from the substrate to the ground.

In other embodiments, the energizing electrode assembly has conductive tips 605 separated into a first electrically connected group and a second electrically connected group, wherein at least one of the first or second electrically connected group of the conductive tips is made of conductive tips that has internal passageways in fluid communication with the internal volume 602 of chamber 601, so that a gas mixture comprising a reducing gas flowing into chamber 601 can be injected out from each conductive tip 605, wherein the at least one group of the conductive tips 605 is connected to a DC voltage source that is negatively biased and the other of the first or second electrically connected group is connected to a DC voltage source that is positively biased, and wherein the DC voltage source that is negatively biased and the DC voltage source that is positively biased are electrically connected to a functional controller that is capable of alternating a supply of energy between the DC voltage source that is negatively biased and the DC voltage source that is positively biased. A gas mixture comprising a reducing gas is then flown through chamber 601 and through each conductive tip 605 having internal passageways 611 and at least one group of the conductive tips 605 is activated via a DC voltage source that is negatively biased, so that electrons can be generated from each conductive tip 605, wherein at least a portion of the electrons attach to at least a portion of the reducing gas that following out from each conductive tip 605 thereby forming a negatively charged reducing gas. In this or other embodiments, the array of protruding conductive tips can be a mixture of conductive tips having internal passageways and conductive tips that do not have internal passageways. The latter conductive tips, or those that do not have internal passageways, can be used to retrieve at least a portion of the excess electrons. The other group of conductive tips 605 are then energized by activating the DC voltage source that is positively biased to retrieve excess electrons from the treating surface of substrate 606, wherein the at least one group of conductive tips 605 electrically connected to the DC voltage source that is negatively biased and the other group of conductive tips 605 electrically connected to the DC voltage source that is positively biased are not energized at the same time.

In certain embodiments, at least a portion of the reducing gas mixture may be flowed through the internal passageways 611 of conductive tips 605, directly into target area 609, or combinations thereof. The negatively charged reducing gas then contacts the treating surface 608 of substrate 607 with the negatively charged reducing gas to reduce the metal oxides on the treating surface 608 of the substrate 607. In this or other embodiments, a portion of the reducing gas can flowed through the conductive tips 605 having internal passageways and the balance of the reducing gas mixture or components thereof such as $N_2$ can be flowed directly into target area 609 to form the reducing gas mixture in situ.

Figure 17:
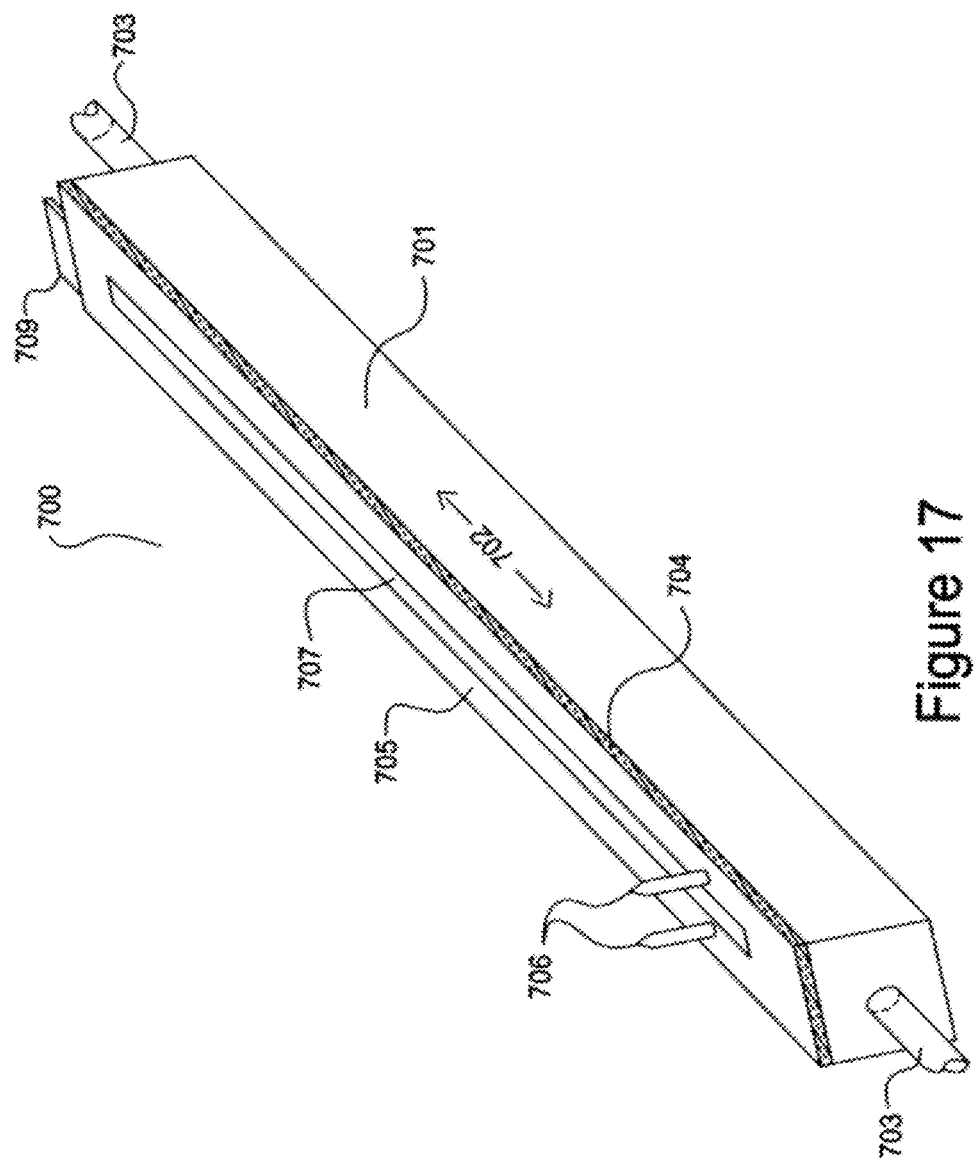
FIG. 17 provides an isometric view of another embodiment of the electrode assembly described herein.

Yet another embodiment of the electrode assembly described herein is depicted in FIG. 17. FIG. 17 provides an isometric view of an embodiment of an energizing electrode assembly 700 comprising a chamber 701 having an internal volume 702, gas inlets 703, an insulating plate 704, a conductive pin plate 705 having conductive tips 706 and a slot 707. Insulating plate 704 in embodiment depicted in FIG. 17 acts to isolate the conductive pin plate 705 from chamber 701, which allows a gas, comprising the reducing gas, inert gas, carrier gas, and combinations thereof, to flow through internal volume 702 and out into a target area (not shown). Energizing electrode 700 can be a monolithic assembly or, alternatively, a plurality of modular assemblies which are arranged in series to allow for easy access for part replacement, gas distribution control, etc. A more detailed view of chamber 701 is provided in FIGS. 18(a) and 18(b) which provides a side and top view, respectively. A more detailed view of conductive pin plate 705 is provided in FIGS. 19(a) and 19(b) which provides a side and top view, respectively.

Figure 18A:
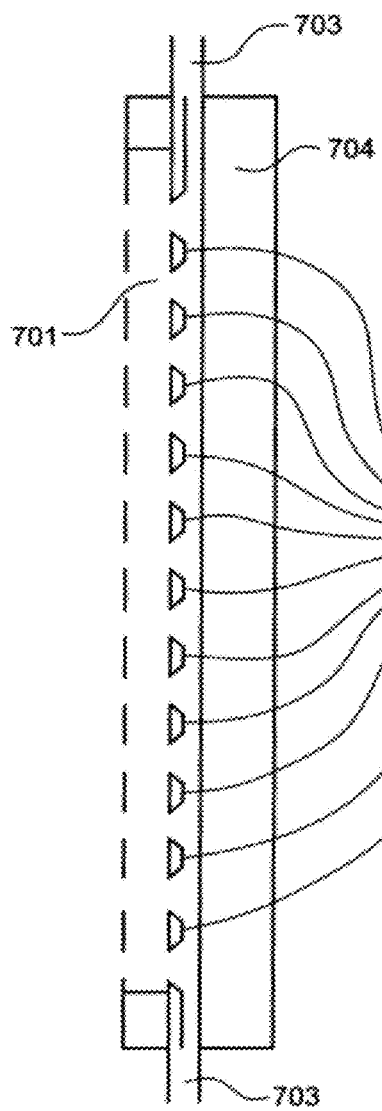
FIGS. 18(a) and 18(b) provide a side view and top view, respectively, of certain features of the electrode assembly of FIG. 17.
Figure 18B:
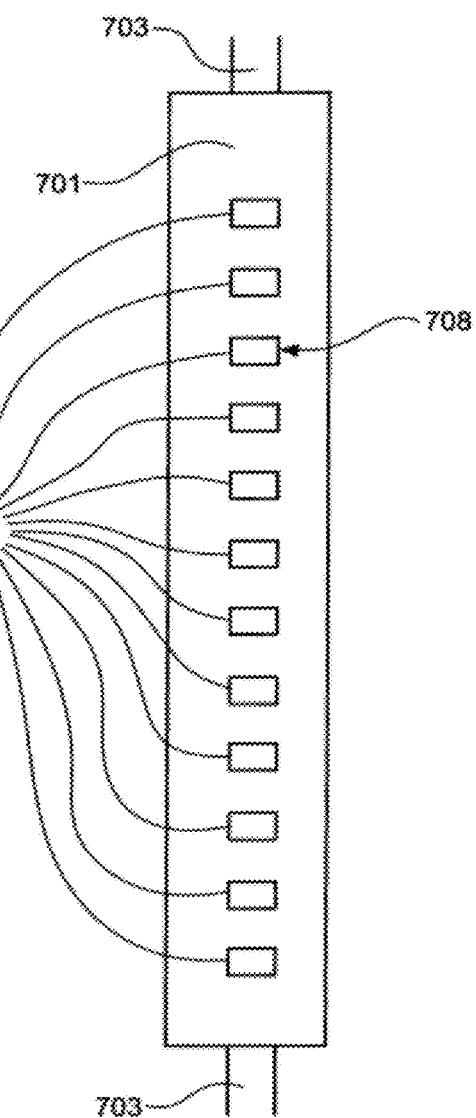

Referring to FIGS. 18(a) and 18(b), energizing electrode 700 comprises a chamber 701 further comprising an array of holes 708 whereby gas can pass through gas inlets 703 prior to passing through longitudinal slot 707 (not shown) in insulating plate 704 and conductive pin plate 705. Gas distribution block 701 is depicted in FIGS. 16, 17(a), and 18(b) as having a pair of gas inlets that provide a balanced flow of gas into chamber 701. Holes 708 are in fluid communication with gas inlets 703 and longitudinal slot 707. In side view 18(a), holes 708 are shown as being chamfered or "funnel shaped". However, other shapes for holes 708 which can optimize the flow of gas through chamber 701 into holes 708 and through longitudinal slot 707 (not shown) and into the target area (not shown) may be used. In side view 16(b), the top view of holes 708 are shown as being square. However, other shapes for holes 708 such as, for example, circular, elliptical, triangular, or other may be used. The arrangement of holes 708 may be selected such that the flow of gas through gas inlet 703 into the internal volume 702 of chamber 701, through insulating layer 704, and longitudinal slot 707 is optimized.

Figure 19A:
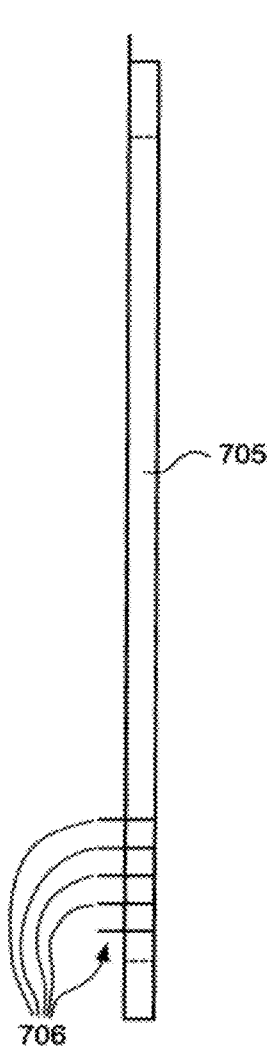
FIGS. 19(a) and 19(b) provide a side view and top view, respectively, of certain features of the electrode assembly of FIG. 17.
Figure 19B:
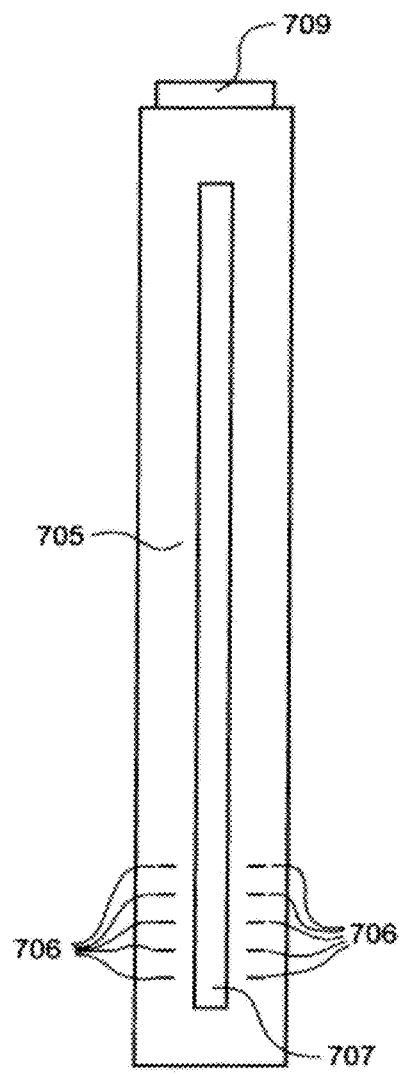

FIGS. 19(a) and 19(b) provides a side and top view of further aspects of conductive pin plate 705. FIG. 19(a) shows the arrangement of the plurality of conductive tips 706 on conductive pin plate 705. At least a portion of conductive tips 706 can be solid, having an internal passageway in fluid communication with internal volume 702 of chamber 701, or combinations thereof. FIG. 19(b) provides a top view of conductive pin plate 705 further illustrating slot 707 which is shown as residing between two rows of conductive tips 706. Conductive pin plate 705 further comprises one or more power connectors 709 which is in electrical communication to a central processing unit to control flow of energy to the array of conductive tips 706. A gas such as the reactive gas, a carrier gas, an inert gas, and combinations thereof may flow through longitudinal slot 709 into the target area (not shown). The flow of gas through conductive pin plate 603 may be controlled by a baffling system in the chamber 701 (see FIGS. 18(a) and 18(b)) and via flow meters or mass flow controllers that are in electrical communication to the gas distribution block via power connector 709. The dimensions of longitudinal slot 707 on conductive pin plate 705, insulating plate 704 and the dimensions of the gas flow apertures 708 can be determined via computer modeling or gas distribution modeling to achieve the optimum gas flow parameters. In this or other embodiments, one or more supplemental gases may be added to the gas mixture or alternated with the gas mixture, can be introduced into the target area (not shown) through standard gas plates that are commonly seen in reflow furnaces or other methods that will not dilute the reactive gas or the activated species.

The method and apparatus described herein will be illustrated in more detail with reference to the following examples, but it should be understood that the present method and apparatus is not deemed to be limited thereto.

EXAMPLES

Example 1

A first experiment was conducted by using a lab-scale furnace. The sample used was a fluxless tin-lead solder preform (melting point 183° C.) on a grounded copper plate (anode), which was loaded inside a furnace and heated up to 250° C. under a gas flow of 5% $H_2$ in $N_2$. When the sample temperature was at equilibrium, a DC voltage was applied between the negative electrode (cathode) and the grounded sample (anode) and gradually increased to about −2 kV with a current of 0.3 mA. The distance between the two electrodes was about 1 cm. The pressure was ambient, atmospheric pressure. It was found that the solder was indeed very well wetted on the copper surface. Without applying an electric voltage, a good wetting of a fluxless solder on a copper surface can never be achieved at such low temperature, even in pure $H_2$, because the effective temperature for pure $H_2$ to remove tin-oxides on a tin-based solder is above 350° C. Therefore, this result confirms that the electron-attachment method is effective in promoting $H_2$ fluxless soldering.

Example 2

Several cathode materials were investigated for electron-attachment assisted hydrogen fluxless soldering by using the field emission mechanism using the same set-up as Example 1. The results of the investigation is provided in Table I.

As Table I illustrates, the best result was obtained by using a Ni/Cr cathode, which provided the highest fluxing efficiency and thus resulted in the shortest wetting time. It is believed that the Ni/Cr cathode generates a relatively larger quantity of electrons and has suitable energy level of the electrons compared to other cathode materials.

TABLE I

Effect of Cathode Material on Wetting Time at 250° C. and 20% $H_2$

| Material of Cathode Rod with a Sharp Tip (1/16" dia.) | Time to Complete Wetting |
|---|---|
| Brass | 1 min 55 sec |
| Copper | 1 min 44 sec |
| Nickel Chromium | 39 sec |
| Aluminum | 1 min 28 sec |
| Stainless Steel | 1 min |
| Tungsten | 1 min 54 sec |

Example 3

The present example was conducted to investigate the effectiveness of the thermal-field emission method for generating electrons. A 3 mm diameter graphite rod, having a number of 1 mm long machined tips protruding from its surface, acted as the cathode and had a geometry similar to that depicted in FIG. 2i. Each of the protruding machined tips had a tip angle of 25 degrees. The graphite rod was heated up in a gas mixture of 5% $H_2$ and 95% $N_2$ to about 400 to 500° C. by resistive heating using an AC power source. A DC voltage source of 5 KV was applied between the graphite cathode and a copper plate that acted as an anode having a 1.5 cm gap therebetween. All the tips on the graphite rod were illuminated thereby indicating that electrons could uniformly be generated from the distributed tips on the graphite rod. Without heating of the graphite rod, there would be either no electron emission from the cathode, or arcing between one of the tips and the anode plate. This demonstrates that the combination of using a cathode having multiple tips and elevated temperatures, i.e., a thermal-field emission method, is effective for obtaining uniform electron emission from an integrated emitting system.

Example 4

The present example was conducted using a 0.04" diameter nickel-chromium alloy heating wire clamped horizontally between two machined $Al_2O_3$ refractory plates such as the electrode illustrated in FIG. 4. A series of five nickel-chromium alloy emitting wires, each with a sharp tip (12.5 degree) on one end of the wire, protruded perpendicularly from the nickel-chromium heating wire and were vertically positioned between two refractory plates. The nickel-chromium heating wire and tips were heated up in a gas mixture of 5% $H_2$ and 95% $N_2$ to about 870° C. using an AC power source. A DC voltage of 2.6 KV was applied between the cathode and a copper plate that acted as the anode having a 6 mm gap between the two electrodes. All five tips were illuminated and the total emission current reached 2.4 mA. Without heating of the wire, there would be either no electron emission from the cathode, or arcing between one of the tips and the anode plate. Like example 3, example 4 demonstrates that thermal-assisted field emission provides uniform electron emission. Further, because of the higher temperature of the emission electrode, it also increases the quantity of the electron emission at a given electric potential.

Example 5

The present example was conducted to demonstrate the effect of a voltage pulse between two electrodes on cathode emission. A single-tip nickel-chromium alloy wire was used as the emission electrode and a grounded copper plate acted as a base electrode. The copper plate was located 3 mm below the tip of the emission electrode. A tin/lead solder preform was disposed upon the copper plate. The nickel-chromium wire, preform, and copper plate were maintained in a furnace at ambient temperature in a gas mixture of 4% $H_2$ and the remainder $N_2$. A pulsed uni-directional voltage of various frequencies and amplitudes was applied between the two electrodes. In this connection, the electric potential of the emission electrode was varied from negative to zero relative to the grounded base electrode thereby allowing electrons to be generated from the tip electrode. The results are provided in Table II.

The results in Table II indicate that greater quantities of electrons are generated from the emission electrode when a voltage pulse of higher pulsing frequency and amplitude is applied.

TABLE II

| | Uni-Directional Voltage Pulse | | | | |
|---|---|---|---|---|---|
| | Pulsing Frequency (Hz) | | | | |
| | 0 | 250 | 500 | 1000 | 2500 |
| Emission Current at 3.4 kV Pulsing Amplitude (mA) | 0 | 0.3 | 0.4 | 0.5 | 0.6 |
| Emission Current at 1.0 kV Pulsing Amplitude (mA) | 0 | 0.1 | 0.1 | 0.2 | 0.2 |

Example 6

The present example was conducted to demonstrate surface discharge by altering the polarity of the two electrodes using the same set-up as example 5.

A bi-directional voltage pulse with a total pulsing amplitude of 3.4 kV (e.g. from +1.7 kV to −1.7 kV) was applied between the two electrodes. During the bi-directional voltage pulse, the polarity of the two electrodes was changed. In other words, the tip of the emission electrode was varied from a positive to a negative electrical bias relative to the grounded base electrode thereby allowing electrons to be generated from and retrieved to the tip electrode.

Table III provides the leakage current from the base electrode for each frequency of the polarity change. As Table III illustrates, the higher the frequency of the polarity change, the lower the charge build up will be by observing the leakage current passing through the copper base electrode.

TABLE III

| Bi-Directional Voltage Pulse | | | | |
| --- | --- | --- | --- | --- |
| Pulsing Frequency (Hz) | 250 | 500 | 1000 | 2500 |
| Leakage Current (mA) | 0.00069 | 0.00054 | 0.00015 | 0.00015 |

Example 7

The present example was conducted to demonstrate remote surface discharge by employing an additional electrode. A 90Pb/10Sn solder preform having a melting point of 305° C. was set on a small piece of a copper substrate that was set on an electrically insulated wafer. A grounded copper plate was placed underneath the wafer and acted as a base electrode. Two single-tip nickel-chromium wires, one with a negative voltage and one with a positive voltage, were installed 1 cm above the base electrode with the solder preform. The distance between the two single-tip electrodes was 1.5 cm. The arrangement was heated within a gas mixture containing 4% $H_2$ in $N_2$ from room temperature to a given reflow temperature above the melting point of the solder. When the reflow temperature reached equilibrium, electron attachment was started by applying the positive and the negative voltages to the two single-tip electrodes and the time required for the solder preform to form a spherical ball was recorded. The formation of a spherical solder ball indicated an oxide-free solder surface. As shown in Table IV, the surface de-oxidation is quite efficient at a range of temperature from 310 to 330° C., which is only 5 to 15° C. above the melting point of the solder.

TABLE IV

| Isotherm Reflow Temperature (° C.) | 310 | 320 | 330 |
| --- | --- | --- | --- |
| Ball formation Time (seconds) | 20, 18, 20, 24 | 17, 13, 16 | 14, 12 |
| Average Ball Formation Time (seconds) | 20.5 | 15.3 | 13 |

Example 8

A quartz-plate based electrode was installed inside a furnace. The space between metal pins on the quartz plate was 0.5 cm. The substrate was a copper plate on a ceramic substrate which, in turn, was put on a grounded electrode (i.e., a base electrode). The gap between the tips of metal pins on the quartz plate and the copper surface was 1 cm. The furnace was purged by 5% $H_2$ balanced with $N_2$. A pulsed voltage ranging from 0 to −3.12 kV with a pulsing frequency of 10 kHz was applied on the quartz electrode. A uniform electron emission from all the emission pins was observed. The average emission current from each emission pin was around 0.3 mA. Significantly, no arcing was observed in this embodiment where the space between the emission tips was as small as 0.5 cm. This result demonstrates that the threshold voltage for a uniform electron emission from the quartz-plate based electrode is largely reduced to a level much below that of gas ionization.

Example 9

A quartz-plate based electrode was installed inside a furnace. The space between metal pins on the quartz plate was 1.0 cm. The treating surface was a copper plate that had been pre-oxidized in air at 150° C. for two hours, which made the color of the copper plate darker compared with original copper plate. The oxide thickness was estimated to be ~400 Å by Auger analysis. The pre-oxidized copper plate was put on a ceramic substrate and then located on a grounded electrode. The gap between the tips of metal pins on quartz plate and the surface of the pre-oxidized copper plate was 1 cm. The furnace was purged by 5% $H_2$ balanced with $N_2$ and heated to 200° C. Positive and negative voltages were alternatively applied on two different groups of metal pins with amplitudes of +1.2 kV and −1.2 kV, respectively. The alternating frequency was 15 KHz. A uniform electron emission was observed. After 15 minutes of such electron attachment treatment under the condition described above, the copper plate was taken out of the furnace. It was observed that the color of the treated copper surface was changed to the original copper plate color. Without applying the electron attachment process described herein, the oxide reductions on the surface of the pre-oxidized copper were found to be inefficient in the same heating process.

Example 10

An energizing electrode containing a pyrex glass chamber having an internal volume, a gas inlet in fluid communication with the internal volume, and an insulating base which was ceramic base mounted with a plurality of conductive tips each having an internal passageway in fluid communication with internal volume was made as follows. The glass chamber was cylindrical in shape and had a 6.0 cm diameter and 8.0 cm height. The ceramic base plate was drilled with an array of 97 holes each having a 0.65 mm diameter and spaced 5 mm apart. Each conductive tip had an interior passageway that was in fluid communication with the internal volume of the chamber, an external 0.64 diameter, a 0.32 internal diameter, a tip having a 12 degree angled slanted end, and a flanged end having a 0.9 mm outer diameter. All 97 conductive tips were inserted into the ceramic base plate and held in place at the flanged end. A nickel chromium wire with a diameter of 0.0035 inch was used to electrically connect all the 97 conductive tips by soldering using a high temperature solder. The assembled energizing electrode was installed inside a laboratory-scale furnace. Five fluxless tin-lead solder performs having a melting point of 183° C. and dimensions of 2 mm diameter and 1 mm height were put on different locations of a grounded, square-shaped 10 cm by 10 cm copper plate which acted as a base electrode. The copper plate with the solder performs on its top surface was located 1 cm below the end points of the conductive tips of the energizing electrode inside the furnace. A reducing gas mixture of 5% $H_2$ and 95% $N_2$ was introduced into the furnace during heating. When an equilibrium temperature of 220° C. was reached, a pulsed voltage ranging from 0 to −3 kV at a pulsing frequency of 10 kHz was applied on the energizing electrode. A uniform electron emission from all the needle tips was observed. The average emission current from each needle tip was around 0.3 mA. After a 30 second electron emission, the experiment was stopped and the sample was taken out of the furnace after the furnace was cooled down. It was found that all the solder preforms were well wetted on the copper plate.

By way of comparison, a similar emission electrode assembly was placed into the same furnace but it did not the same conductive tips having internal passageways therethrough in fluid communication with the internal volume of the glass chamber Without using these conductive tips having the internal passageway, the same solder wetting under an area array emission tips could not be obtained unless the furnace temperature was above 250° C. and the emission time was longer than 1 minute. This comparison demonstrates that the use of an energizing electrode comprising an internal volume having conductive tips with internal passageways in fluid communication with the internal volume that allows for the flow of the hydrogen-containing reducing gas improves the efficiency of the electron attachment process.

The invention claimed is:

1. A method of removing a metal oxide from a treating surface of a substrate, the method comprising:
    providing a substrate which is proximal to a base electrode having a grounded electrical potential, the substrate comprising a treating surface comprising the metal oxide;
    providing an energizing electrode that is proximal to the base electrode and the substrate, wherein at least a portion of the treating surface is exposed to the energizing electrode and wherein the base electrode and the energizing electrode and the substrate reside within a target area, wherein the energizing electrode is defined by an insulated plate comprising an array of protruding conductive tips, wherein the conductive tips are electrically connected by a conductive wire, wherein a portion of the array is separated into a first electrically connected group and a second electrically connected group wherein one of the first or second electrically connected group is connected to a DC voltage source that is positively biased and the other of the first or second electrically connected group is connected to a DC voltage source that is negatively biased, and wherein the DC voltage source that is positively biased and the DC voltage source that is negatively biased are electrically connected to a functional controller that is capable of alternating a supply of energy between the DC voltage source that is negatively biased and the DC voltage source that is positively biased;
    passing a gas mixture comprising a reducing gas through the target area;
    energizing one of the first or second electrically connected group of conductive tips by activating the DC voltage source that is negatively biased to generate electrons within the target area, wherein at least a portion of the electrons attach to at least a portion of the reducing gas thereby forming a negatively charged reducing gas;
    contacting the treating surface with the negatively charged reducing gas to reduce the metal oxides on the treating surface of the substrate; and
    energizing the other of the first or second electrically connected group of conductive tips by activating the DC voltage source that is positively biased to retrieve excess electrons from the treating surface, wherein the group of conductive tips electrically connected to the DC voltage source that is negatively biased and the group of conductive tips electrically connected to the DC voltage source that is positively biased are not energized at the same time;
    wherein the energizing electrode further comprises an internal volume and a gas inlet in fluid communication with the internal volume, wherein at least a portion of the conductive tips have an internal passageway in fluid communication with the internal volume and wherein at least a portion of the reducing gas passes through the gas inlet into the internal volume and through the internal passageway into the target area.

2. The method of claim 1 wherein the gas mixture further comprises a carrier gas selected from the group consisting of: nitrogen, helium, neon, argon krypton xenon, radon, and mixtures therefore.

3. The method of claim 1 wherein the base electrode and the energizing electrode are spaced apart from one another by a distance of from about 0.5 cm to about 5.0 cm.

4. The method of claim 1 wherein the base electrode and the energizing electrode are spaced apart from one another by a distance of 1.0 cm.

5. The method of claim 1 wherein the voltage ranges from 0.1 kV to 30 kV.

6. The method of claim 1 wherein the voltage is pulsed at a frequency between 0 kHz and 30 kHz.

7. The method of claim 1 wherein the substrate is at a temperature ranging from 100° C. to 400° C.

8. The method of claim 1 wherein the voltage is pulsed at a frequency between 0 kHz and 50 kHz to prevent arcing.

9. The method of claim 1 wherein the treating surface further comprises solder bumps.

10. The method of claim 1 wherein the substrate is an insulated substrate selected from the group consisting of: a rigid epoxy glass laminate substrate, a flexible flex polymeric substrate, a substrate used in an integrated circuit interconnection scheme, a high density interconnect, a substrate used in stacked integrated circuit, and a substrate used in a stacked package.

11. The method of claim 1 wherein the protruding conductive tips are removably attached to the insulated plate.

12. The method of claim 1 wherein the insulated plate comprises a material selected from the group consisting of: quartz, a ceramic material, a polymer, and mixtures thereof.

13. The method of claim 12 wherein the insulated plate comprises a polymer.

14. The method of claim 12 wherein the insulated plate is a quartz plate.

15. The method of claim 14 wherein the polymer is an epoxy polymer.

16. The method of claim 1 wherein the reducing gas is a gas selected from the group consisting of $H_2$, CO, $SiH_4$, $Si_2H_6$, $CF_4$, $SF_6$, $CF_2Cl_2$, HCl, $BF_3$, $WF_6$, $UF_6$, $SiF_3$, $NF_3$, $CClF_3$, HF, $NH_3$, $H_2S$, straight, branched or cyclic $C_1$ to $C_{10}$ hydrocarbons, formic acid, alcohols, acidic vapors having the following formula (III):

$$R-\underset{\underset{\displaystyle}{\|}}{\overset{O}{C}}-OH, \qquad (III)$$

organic vapors having the following formula (IV):

$$R-\underset{\underset{\displaystyle}{\|}}{\overset{O}{C}}-H, \qquad (IV)$$

and mixtures thereof, wherein substituents R in formula (III) and formula (IV) is an alkyl group, a substituted alkyl group, an aryl group, or a substituted aryl group.

17. The method of claim 16 wherein the reducing gas comprises $H_2$.

18. The method of claim 17 wherein the concentration of $H_2$ in the reducing gas is from 0.1 to 100 volume %.

19. The method of claim 1 wherein the conductive tips are spaced apart from each other by a distance of from about 2 mm to 10 mm.

20. The method of claim 19 wherein the conductive tips are spaced apart from each other by a distance of from about 5 mm to about 8 mm.

21. The method of claim 20 wherein the conductive tips are spaced apart from each other by a distance of about 5 mm.

* * * * *